(12) United States Patent
Zievers

(10) Patent No.: US 11,494,322 B2
(45) Date of Patent: Nov. 8, 2022

(54) COMPUTING SYSTEM WITH HARDWARE RECONFIGURATION MECHANISM AND METHOD OF OPERATION THEREOF

(71) Applicant: Xcelemor, Inc., Naperville, IL (US)

(72) Inventor: Peter J. Zievers, Naperville, IL (US)

(73) Assignee: Xcelemor, Inc., Naperville, IL (US)

( * ) Notice: Subject to any disclaimer, the term of this patent is extended or adjusted under 35 U.S.C. 154(b) by 0 days.

(21) Appl. No.: 16/297,431

(22) Filed: Mar. 8, 2019

(65) Prior Publication Data

US 2019/0205271 A1    Jul. 4, 2019

Related U.S. Application Data

(63) Continuation of application No. 13/464,627, filed on May 4, 2012, now abandoned.

(Continued)

(51) Int. Cl.
*G06F 13/00* (2006.01)
*G06F 13/16* (2006.01)
*G06F 15/78* (2006.01)
*H04L 45/00* (2022.01)
*H04L 49/10* (2022.01)
(Continued)

(52) U.S. Cl.
CPC ...... *G06F 13/1689* (2013.01); *G06F 11/1458* (2013.01); *G06F 13/1694* (2013.01); *G06F 13/4022* (2013.01); *G06F 15/173* (2013.01); *G06F 15/781* (2013.01); *G06F 15/7803* (2013.01); *G06F 30/331* (2020.01); *H04L 43/0811* (2013.01); *H04L 45/22* (2013.01); *H04L 49/10* (2013.01); *H04L 49/15* (2013.01); *G06F 1/24* (2013.01); *G06F 9/24* (2013.01);

*G06F 15/177* (2013.01); *G06F 30/33* (2020.01); *G06F 30/34* (2020.01); *G06F 2201/84* (2013.01); *H04L 12/50* (2013.01); *H04L 49/101* (2013.01); *H04L 49/1515* (2013.01); *H04L 49/25* (2013.01)

(58) Field of Classification Search
CPC .............. G06F 15/7867; G06F 17/5054; H04B 2201/70711; H04B 2201/70711
USPC ........................................................ 710/104
See application file for complete search history.

(56) References Cited

U.S. PATENT DOCUMENTS 7,120,571 B2   10/2006   Shei et al.
7,185,299 B1 *  2/2007   Jayaraman .............. G06F 30/34
                                                716/121

(Continued)

OTHER PUBLICATIONS

Hubner et al., "A Heterogeneous Multicore System on Chip With Run-Time Reconfigurable Virtual FPGA Architecture"; Publication Year: 2011; Parallel and Distributed Processing Workshops and Phd Forum (IPDPSW) pp. 143-149.

(Continued)

*Primary Examiner* — Chun Kuan Lee
(74) *Attorney, Agent, or Firm* — Wong & Rees LLP

(57) ABSTRACT

A method of operation of a computing system includes: providing a first cluster having a first kernel unit for managing a first reconfigurable hardware device; analyzing an application descriptor associated with an application; generating a first bitstream based on the application descriptor for loading the first reconfigurable hardware device, the first bitstream for implementing at least a first portion of the application; and implementing a first fragment with the first bitstream in the first cluster.

20 Claims, 9 Drawing Sheets

Related U.S. Application Data

(60) Provisional application No. 61/483,523, filed on May 6, 2011.

(51) Int. Cl.

| | | |
|---|---|---|
| *H04L 49/15* | (2022.01) | |
| *H04L 43/0811* | (2022.01) | |
| *G06F 30/331* | (2020.01) | |
| *G06F 15/173* | (2006.01) | |
| *G06F 11/14* | (2006.01) | |
| *G06F 13/40* | (2006.01) | |
| *H04L 12/50* | (2006.01) | |
| *H04L 49/101* | (2022.01) | |
| *H04L 49/1515* | (2022.01) | |
| *H04L 49/25* | (2022.01) | |
| *G06F 30/33* | (2020.01) | |
| *G06F 30/34* | (2020.01) | |
| *G06F 1/24* | (2006.01) | |
| *G06F 9/24* | (2006.01) | |
| *G06F 15/177* | (2006.01) | |

(56) References Cited

U.S. PATENT DOCUMENTS

| | | | |
|---|---|---|---|
| 8,384,416 B2 * | 2/2013 | Kelem | H03K 19/173 326/9 |
| 8,756,548 B2 | 6/2014 | Zievers | |
| 8,868,894 B2 | 10/2014 | Zievers | |
| 8,869,087 B2 | 10/2014 | Zievers | |
| 9,053,266 B2 | 6/2015 | Zievers | |
| 9,055,069 B2 | 6/2015 | Zievers | |
| 9,055,070 B2 | 6/2015 | Zievers | |
| 9,152,748 B2 | 10/2015 | Zievers | |
| 9,495,310 B2 | 11/2016 | Zievers | |
| 2004/0049672 A1 * | 3/2004 | Nollet | G06F 15/7867 713/100 |
| 2004/0174187 A1 * | 9/2004 | New | H03K 19/17792 326/41 |
| 2005/0093571 A1 * | 5/2005 | Suaris | G06F 30/34 326/37 |
| 2005/0097485 A1 * | 5/2005 | Guenthner | G06F 30/34 716/121 |
| 2005/0278680 A1 * | 12/2005 | Mukherjee | G06F 30/34 716/105 |
| 2006/0003757 A1 * | 1/2006 | Subramanian | H04B 1/0003 455/418 |
| 2008/0229320 A1 * | 9/2008 | Ueda | G06F 9/5038 718/104 |
| 2010/0274550 A1 | 10/2010 | Chou et al. | |
| 2012/0284379 A1 | 11/2012 | Zievers | |
| 2012/0284438 A1 | 11/2012 | Zievers | |
| 2012/0284439 A1 | 11/2012 | Zievers | |
| 2012/0284492 A1 | 11/2012 | Zievers | |
| 2012/0284501 A1 | 11/2012 | Zievers | |
| 2012/0284502 A1 | 11/2012 | Zievers | |
| 2013/0346639 A1 | 12/2013 | Stroud | |
| 2015/0234755 A1 | 8/2015 | Zievers | |

OTHER PUBLICATIONS

Jia, Huiqin, "Development of CPU Module Test Device Based on the Virtual Instrument"; Publication Year: 2011; Electronic and Mechanical Engineering and Information Technology (EMEIT) vol. 3; pp. 1308-1312.

Luo et al., "LIN Network Simulation System Based on LavVIEW"; Publication Year: 2010: Computer Design and Applications (ICCDA) vol. 5: pp. V5-299-V5-303.

U.S. Appl. No. 13/464,627, Advisory Action dated Feb. 21, 2017.
U.S. Appl. No. 13/464,627, Advisory Action dated Nov. 30, 2017.
U.S. Appl. No. 13/464,627, Final Office Action dated Nov. 25, 2013.
U.S. Appl. No. 13/464,627, Final Office Action dated Jun. 30, 2014.
U.S. Appl. No. 13/464,627, Final Office Action dated Jan. 14, 2016.
U.S. Appl. No. 13/464,627, Final Office Action dated Nov. 21, 2016.
U.S. Appl. No. 13/464,627, Final Office Action dated Sep. 19, 2017.
U.S. Appl. No. 13/464,627, Final Office Action dated Sep. 10, 2018.
U.S. Appl. No. 13/464,627, Non-Final Office Action dated Jun. 14, 2013.
U.S. Appl. No. 13/464,627, Non-Final Office Action dated Mar. 11, 2014.
U.S. Appl. No. 13/464,627, Non-Final Office Action dated Nov. 18, 2014.
U.S. Appl. No. 13/464,627, Non-Final Office Action dated Mar. 30, 2015.
U.S. Appl. No. 13/464,627, Non-Final Office Action dated Sep. 2, 2015.
U.S. Appl. No. 13/464,627, Non-Final Office Action dated May 26, 2016.
U.S. Appl. No. 13/464,627, Non-Final Office Action dated Apr. 3, 2017.
U.S. Appl. No. 13/464,627, Non-Final Office Action dated Mar. 7, 2018.
U.S. Appl. No. 13/464,836, Non-Final Office Action dated Mar. 10, 2014.
U.S. Appl. No. 13/464,873, Final Office Action dated Sep. 11, 2013.
U.S. Appl. No. 13/464,873, Non-Final Office Action dated Apr. 3, 2013.
U.S. Appl. No. 13/464,892, Final Office Action dated Jul. 3, 2014.
U.S. Appl. No. 13/464,892, Non-Final Office Action dated Jan. 30, 2014.
U.S. Appl. No. 13/465,955, Non-Final Office Action dated Jun. 16, 2014.
U.S. Appl. No. 13/465,955, Non-Final Office Action dated Oct. 31, 2014.
U.S. Appl. No. 14/702,527, Notice of Allowance dated Jul. 13, 2016.

* cited by examiner

COMPUTING SYSTEM WITH HARDWARE RECONFIGURATION MECHANISM AND METHOD OF OPERATION THEREOF

CROSS-REFERENCE TO RELATED APPLICATION

This application claims priority as a Continuation of U.S. application Ser. No. 13/464,627, filed May 4, 2012, which claims priority of 61/483,523 filed May 6, 2011, and the entire contents of the foregoing are hereby incorporated by reference as if fully set forth herein, under 35 U.S.C. § 120.

TECHNICAL FIELD

The present invention relates generally to a computing system and more particularly to a system for hardware reconfiguration.

BACKGROUND ART

Electronic hardware with integrated circuits is used in virtually all electronic equipment today and has revolutionized the world of electronics. The integrated circuits are used in digital computing systems, such as computers, televisions, cellular phones, mobile devices, and digital video cameras.

The integrated circuits that enable virtually every electronics gadget used on a daily basis are constantly being pushed by the semiconductor industry to become faster. However, pure hardware implementation does not allow the flexibility to address the myriad of applications in modern computing system.

Thus, a need still remains for computing systems with flexibility of more functions as well as increased speed. In view of the increasing demand for computing systems with improved integration and performance, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a computing system, including: providing a first cluster having a first kernel unit for managing a first reconfigurable hardware device; analyzing an application descriptor associated with an application; generating a first bitstream based on the application descriptor for loading the first reconfigurable hardware device, the first bitstream for implementing at least a first portion of the application; and implementing a first fragment with the first bitstream in the first cluster.

The present invention provides a computing system, including: a provision module for providing a first cluster having a first kernel unit for managing a first reconfigurable hardware device; a request module for analyzing an application descriptor associated with an application; an allocation module for generating a first bitstream based on the application descriptor for loading the first reconfigurable hardware device, the first bitstream for implementing at least a first portion of the application; and an execution module for implementing a first fragment with the first bitstream in the first cluster.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The term "module" referred to herein includes hardware in the present invention in accordance with the context in which the term is used. For example, the hardware can include circuitry, programmable circuitry, computer, integrated circuit, integrated circuit cores, a pressure sensor, an inertial sensor, a microelectromechanical system (MEMS), passive devices, or a combination thereof.

Figure 1:
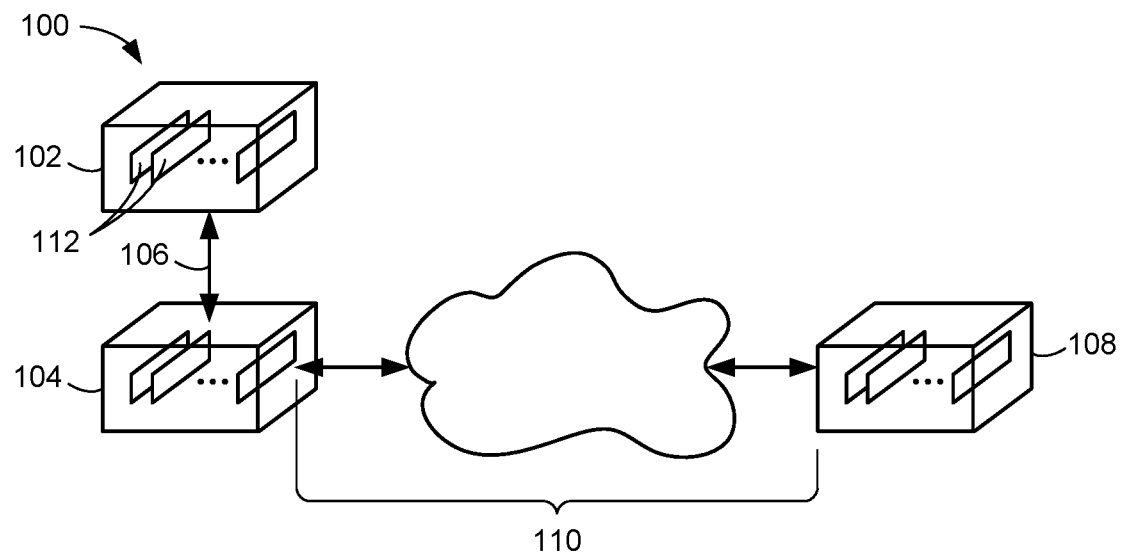
FIG. 1 is a computing system with hardware reconfiguration mechanism in an embodiment of the present invention.

Referring now to FIG. 1, therein is shown a computing system 100 with hardware reconfiguration mechanism in an embodiment of the present invention. The computing system 100 can represent an adaptive architecture execution environment.

The computing system 100 can include a first electronic equipment 102 connected to a second electronic equipment 104 through a first communication path 106. The computing system 100 can include a third electronic equipment 108 connected to the second electronic equipment 104 through a second communication path 110.

For example, the first electronic equipment 102, the second electronic equipment 104, or the third electronic equipment 108 can represent a non-mobile device or a mobile device. As specific examples, the first electronic equipment 102, the second electronic equipment 104, or the third electronic equipment 108 can be a server, a server farm, a computer, a grid-computing resource, a virtualized computer resource, a cloud computing resource, a router, a switch, a peer-to-peer distributed computing device, a network equipment, a storage enclosure, or a combination thereof. As additional specific examples, the first electronic equipment 102, the second electronic equipment 104, or the third electronic equipment 108 can be a cellular phone, a personal digital assistant, a notebook computer, a multi-functional mobile communication device, or an entertainment device.

The first communication path 106, as an example, can represent a wireless network, a wired network, or a combination thereof for box-to-box connectivity. The first communication path 106 can include wireless communication, wired communication, optical, ultrasonic, or a combination thereof. Bluetooth, Infrared Data Association standard (IrDA), wireless fidelity (WiFi), and worldwide interoperability for microwave access (WiMAX) are examples of wireless communication for the first communication path 106. Ethernet, Fiber Channel, and Peripheral Component Interconnect (PCI) are also examples of wired communication for the first communication path 106.

The second communication path 110, for example, can represent a wireless network, a wired network, or a combination thereof for connectivity over a network. The second communication path 110 can include wireless communication, wired communication, optical, ultrasonic, cloud network, or a combination thereof. Satellite communication, cellular communication, Bluetooth, Infrared Data Association standard (IrDA), wireless fidelity (WiFi), and worldwide interoperability for microwave access (WiMAX) are examples of wireless communication for the second communication path 110. Ethernet, digital subscriber line (DSL), fiber to the home (FTTH), and plain old telephone service (POTS) are also examples of wired communication for the second communication path 110.

Further, the second communication path 110 can traverse a number of network topologies and distances. For example, the second communication path 110 can include direct connection, personal area network (PAN), local area network (LAN), metropolitan area network (MAN), wide area network (WAN), or any combination thereof. Also for example, the second communication path 110 can support timing requirements or quality of service (QoS) features.

Each of the first electronic equipment 102, the second electronic equipment 104, and the third electronic equipment 108 can include a number of line cards 112, which are defined as modular electronic sub-systems. The line cards 112 can be connected together on a backplane or with cables for inside-a-box connectivity. The line cards 112 can be connected together using connectivity methods including electrical connectors, optical fiber connectors, or waveguide connectors.

The line cards 112 can include an electronic component including an application-specific integrated circuit (ASIC), a field-programmable gate array (FPGA). For example, the line cards 112 can represent server blades, expansion cards, or interface cards for routers or switches.

Figure 2:
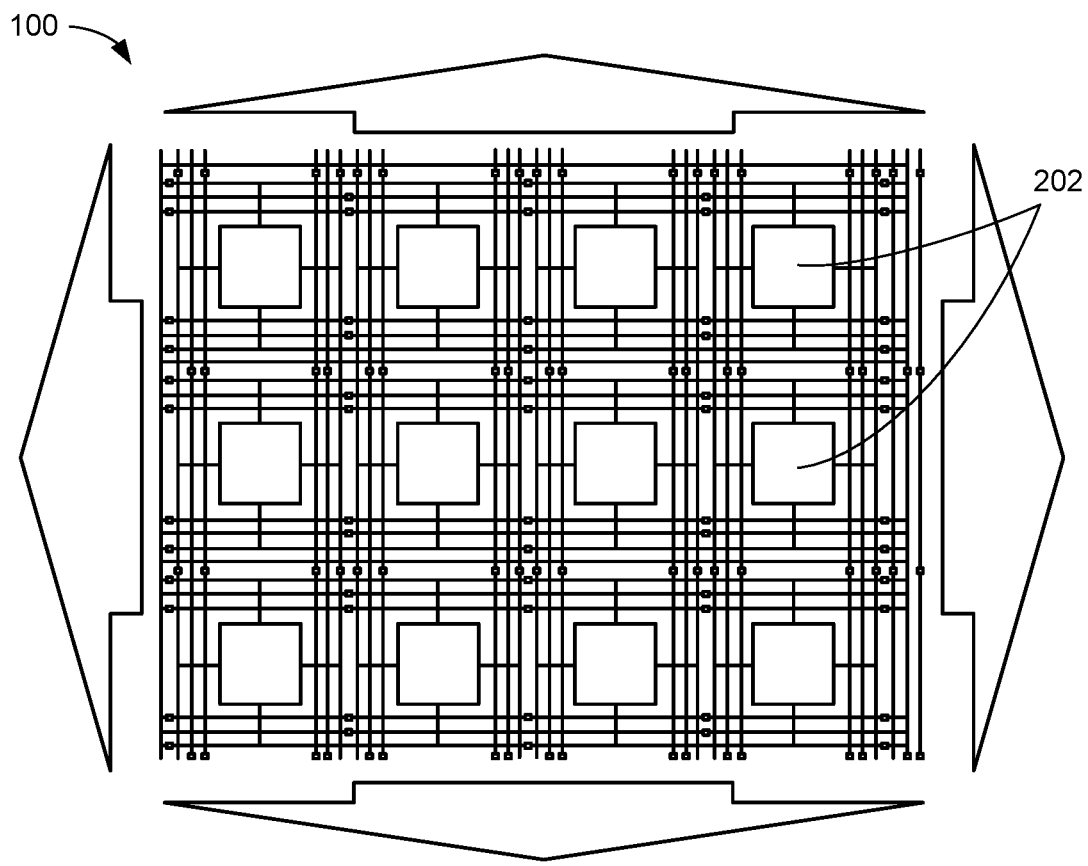
FIG. 2 is an architecture diagram of the computing system.

Referring now to FIG. 2, therein is shown an architecture diagram of the computing system 100. The computing system 100 can include a number of reconfigurable hardware devices 202. The reconfigurable hardware devices 202 are defined as programmable devices in which functionality of logic gates or units is customizable thereby providing a capability to dynamically change functions within the programmable devices.

The reconfigurable hardware devices 202 can represent the programmable devices with a configurable pool of programmable blocks and reconfigurable interconnects. For example, the reconfigurable interconnects can represent wires or zero-delay interconnection resources. The architecture diagram is depicted with arrows to indicate that any number of the reconfigurable hardware devices 202 can be placed, routed, and interconnected.

Placement, routing, and interconnections among a number of the reconfigurable hardware devices 202 can be configurable at run-time. A number of the reconfigurable hardware devices 202 can be placed and routed to interconnect or interface to one another on one or more of the line cards 112 of FIG. 1.

For example, the reconfigurable hardware devices 202 can represent the programmable devices including field-programmable gate arrays (FPGAs), programmable logic devices (PLDs), or any other programmable hardware devices. Also for example, the reconfigurable hardware devices 202 can represent target programmable devices. Further, for example, interconnections between the reconfigurable hardware devices 202 can represent the first communication path 106 of FIG. 1, the second communication path 110 of FIG. 1, a backplane, or with cables for inside-a-box connectivity.

Figure 3:
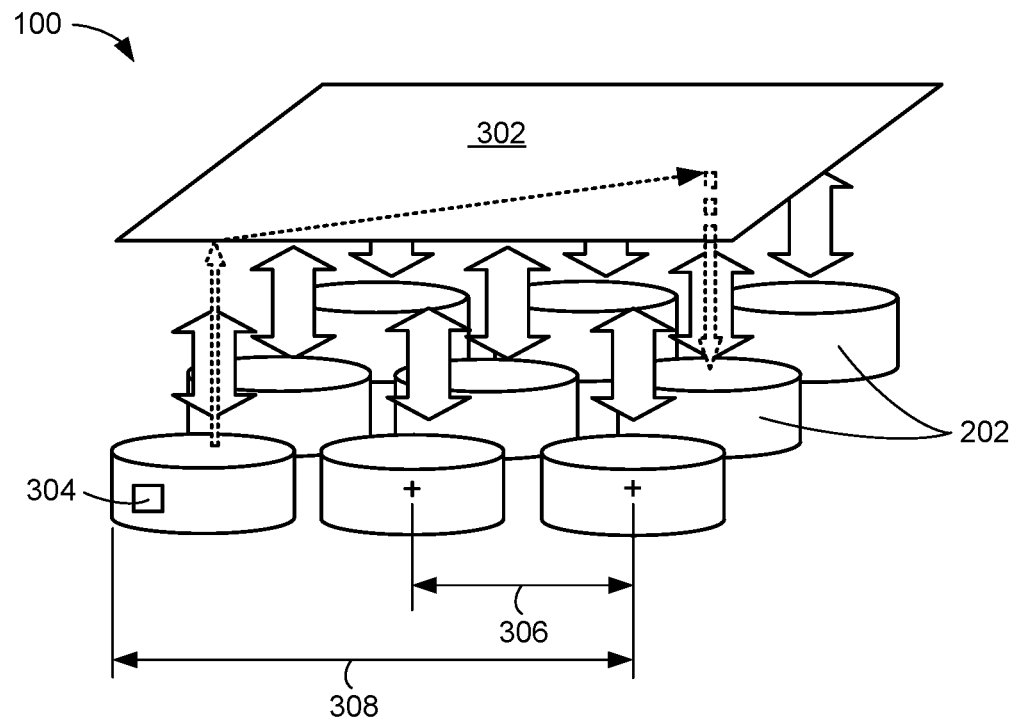
FIG. 3 is a connection diagram of a cross-connection network of the reconfigurable hardware devices.

Referring now to FIG. 3, therein is shown a connection diagram of a cross-connection network 302 of the reconfigurable hardware devices 202. The connection diagram depicts a hierarchical connection that enables the reconfigurable hardware devices 202 to be interconnected. The cross-connection network 302 is defined as an interconnection of hardware resources.

One of the reconfigurable hardware devices 202 can interface to another of the reconfigurable hardware devices 202 through the cross-connection network 302 in a path shown with dash arrows. For example, the cross-connection network 302 can represent the interconnections between the reconfigurable hardware devices 202.

Delay incurred by traversing the cross-connection network 302 can be regulated by managing a number of hierarchical levels in the cross-connection network 302 at implementation time. The implementation time is a time when the reconfigurable hardware devices 202, the line cards 112 of FIG. 1, and a combination thereof are connected together through the cross-connection network 302 before the reconfigurable hardware devices 202 and the line cards 112 are available for operation.

The delay can also be regulated by managing a locality of an application 304 at run-time. The application 304 is defined as a process that is to be launched by a user and executed by the reconfigurable hardware devices 202 in the computing system 100. For illustration purposes, one of the reconfigurable hardware devices 202 is shown to execute the application 304, although it is understood that any number of the reconfigurable hardware devices 202 can be allocated to execute the application 304.

The locality can be provided by mapping the application 304 to one of the reconfigurable hardware devices 202 or multiple of the reconfigurable hardware devices 202 that are within a predetermined distance 306 from each other. The predetermined distance 306 is a distance between centers of the reconfigurable hardware devices 202 that that is less than a distance threshold 308 to ensure a propagation delay less than a fixed numerical value. The distance threshold 308 is a predefined numerical value for determining whether the reconfigurable hardware devices 202 are locally or closely located to each other.

The cross-connection network 302 can include management functions to be effective. A number of the application 304 can discreetly avail themselves of network management functionality through a control interface, leaving complex network maintenance to logic that operates separately from the number of the application 304.

A single application management approach can pre-empt or prevent occurrences of mismatched approaches, which are multiple methods of a variety of sub-systems having conflicting effects in an overall system. The single application management approach provides a single coordination to ensure resources are available for use.

For example, the occurrences can include resource leakage, resource collision, resource starvation, application deadlock, namespace conflict, cross-thread run-time synchronization failure, and cross-thread communication disconnect. As a specific example, the resource leakage occurs when applications do not use the resources available. As another specific example, the resource collision occurs when multiple devices or processes access the same instances of the resources.

As another specific example, the resource starvation occurs when the resources are not allocated for execution of a process because they are used for execution of another process having a higher priority than the process. As another specific example, the application deadlock occurs when two or more processes are simultaneously waiting for each other to free up the resources.

Application logic that is not able to be fit or implemented into a single instance of the reconfigurable hardware devices 202 can require application synchronization at device input ports of each of the reconfigurable hardware devices 202 that are used to implement and execute the application logic. Multiple approaches to the application synchronization can be supported assuming orthogonal application domains, which are groups of applications that are different and operate independently from each other.

The number of the application 304 can coexist in the computing system 100 and therefore can use the same system resources including a memory control interface (not shown) and a network control interface (not shown). Consistency of the application synchronization that applies the same terms and protocols can promote application independence and therefore scalability.

Figure 4:
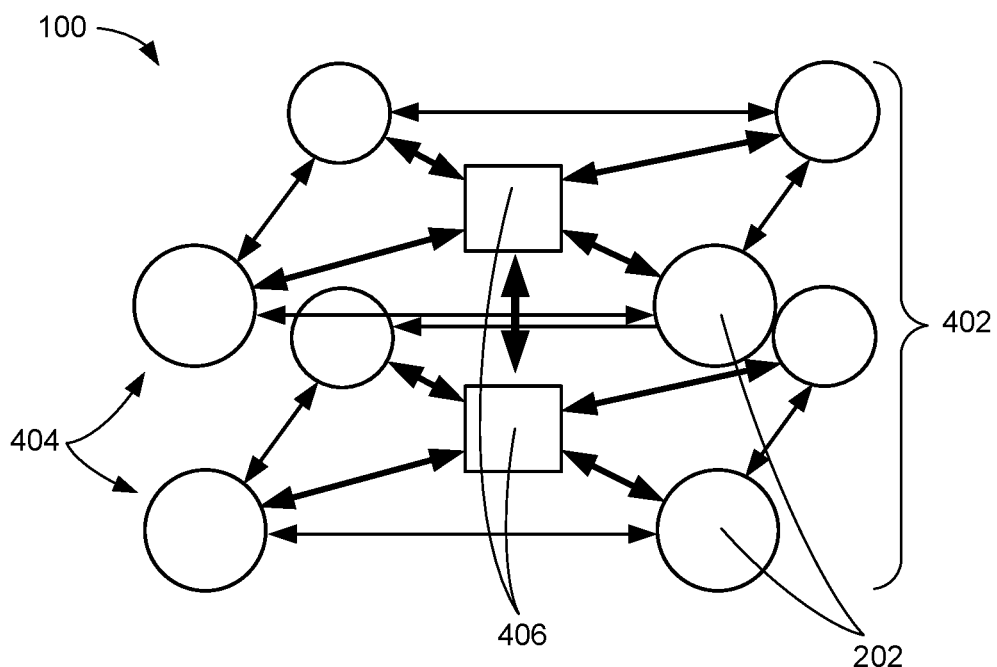
FIG. 4 is a connection diagram of a tandem kernel of the computing system.

Referring now to FIG. 4, therein is shown a connection diagram of a tandem kernel 402 of the computing system 100. The tandem kernel 402 is defined as more than one of clusters 404 connected together.

Each of the clusters 404 is defined as a collection of the reconfigurable hardware devices 202 connected to kernel units 406, whereby the reconfigurable hardware devices 202 are locally located with respect to one another. The term "locally located" refers to the reconfigurable hardware devices 202 within the predetermined distance 306 of FIG. 3 from one another. The computing system 100 can include a number of the clusters 404 connected together through a number of the kernel units 406. Each of the kernel units 406 is defined as a management hardware that includes application management, communication, and synchronization functionality.

The connection diagram depicts the tandem kernel 402 having a first of the kernel units 406 connected to a second of the kernel units 406, with each of the first of the kernel units 406 and the second of the kernel units 406 having four instances of the reconfigurable hardware devices 202. Within the tandem kernel 402, one of the reconfigurable hardware devices 202 of the first of the kernel units 406 can interface with one of the reconfigurable hardware devices 202 of the second of the kernel units 406.

One of the reconfigurable hardware devices 202 can interface with another of the reconfigurable hardware devices 202 within one of the clusters 404 preferably through one of the kernel units 406 of the one of the clusters 404. Optionally, one of the reconfigurable hardware devices 202 of one of the clusters 404 can interface directly with another of the reconfigurable hardware devices 202 of the one of the clusters 404. A number of the kernel units 406 and interconnections between the reconfigurable hardware devices 202 and the number of the kernel units 406, among the number of the kernel units 406, among the reconfigurable hardware devices 202, or a combination thereof can represent portions of the cross-connection network 302 of FIG. 3.

It has been discovered that each of the clusters 404 having one of the kernel units 406 provides improved dynamic allocation of hardware resources because the application 304 of FIG. 3 can be fragmented, mapped, and executed with any number of the reconfigurable hardware devices 202 interface with each other through the one of the kernel units 406.

It has also been discovered that any number of the reconfigurable hardware devices 202 directly interface with each other within one of the clusters 404 provides improved performance with less delays through direct connections as well as provides reduced cost and complexity.

Figure 5:
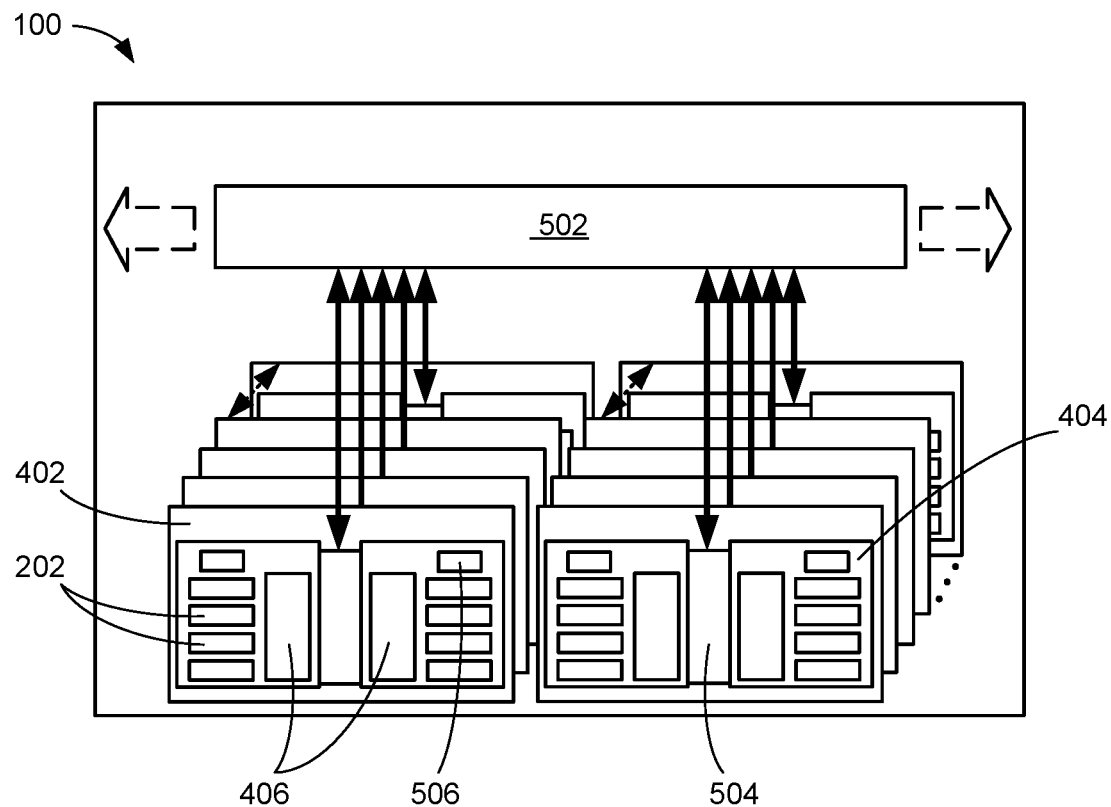
FIG. 5 is a hardware block diagram of the computing system.

Referring now to FIG. 5, therein is shown a hardware block diagram of the computing system 100. The computing system 100 includes a hardware platform with a number of the kernel units 406, a number of the reconfigurable hardware devices 202, and a communication network 502 that can be engaged and interworking altogether as a system.

The computing system 100 includes a dynamic reconfigurable computing platform without any external software intervention during real-time operation. For example, the computing system 100 can provide a complete hardware platform.

The communication network 502 provides an interface and connectivity for the tandem kernel 402 to communicate with another of the tandem kernel 402. The communication network 502 can include switches and communication protocols for sending information and data between one of the kernel units 406 of the tandem kernel 402 to one of the kernel units 406 of another of the tandem kernel 402.

The tandem kernel 402 can include a communication interface 504 to provide communication between the tandem kernel 402 and another of the tandem kernel 402. The communication interface 504 can also provide communication between one of the kernel units 406 and another of the kernel units 406. For example, the communication interface 504 can represent a network interface.

The communication interface 504 can be used for one of the kernel units 406 of the tandem kernel 402 to communicate with one of the kernel units 406 of another of the tandem kernel 402 through the communication network 502.

The communication network 502, the communication interface 504, a number of the kernel units 406, or a combination thereof can represent portions of the cross-connection network 302 of FIG. 3. For example, a number of the tandem kernel 402 can be included on a number of the line cards 112 of FIG. 1. Also for example, a number of the tandem kernel 402 can represent the first electronic equipment 102 of FIG. 1, the second electronic equipment 104 of FIG. 1, or the third electronic equipment 108 of FIG. 1.

The computing system 100 can accommodate a number of different models of the reconfigurable hardware devices 202, each of which can include different input/output (I/O) densities and different computing resources. Suitability of the reconfigurable hardware devices 202 can depend on an application descriptor 506, which is defined as information regarding a make-up or an attribute of the application 304 of FIG. 3 that determines how the reconfigurable hardware devices 202 are to be allocated for implementing the application 304. The application descriptor 506 can include resource requirements for implementing the application 304 of FIG. 3.

The application descriptor 506 can include the operation feature including input/output-intensive (I/O-intensive) or compute-intensive, among other characteristics. For example, the application descriptor 506 can be used to determine a mix of the application 304. I/O-intensive refers to the application 304 that is preferably mapped to programmable hardware resources with a high I/O activity. The high I/O activity refers to a number of input and output ports of a programmable hardware resource greater than a predefined numerical value of input and output ports. For example, the predefined numerical value of input and output ports can be 600. Also for example, I/O-intensive can represent I/O-heavy or high I/O density.

Compute-intensive refers to the application 304 that is preferably mapped to programmable hardware resources with a high compute resource capacity. Compute-intensive applies to the application 304 that demands a lot of computation compared to I/O-intensive that requires more input/output operations.

The application 304 that is I/O-intensive can be placed, routed, and executed more efficiently using a selected model of the reconfigurable hardware devices 202 that is designed for I/O-intensive applications than those for compute-intensive applications. The application 304 that is compute-intensive can be placed, routed, and executed more efficiently using a different model of the reconfigurable hardware devices 202 that is designed for resource-intensive than those for I/O-intensive.

The computing system 100 can be tuned or configured by mixing the clusters 404 differently based on the application descriptor 506. The clusters 404 can represent kernel planes. For example, the application descriptor 506 of the application 304 can be particularly I/O-intensive but the application 304 has compute-intensive ancillary functionality that is most frequently unused.

In the example above, the clusters 404 populated with high I/O density instances of the reconfigurable hardware devices 202 can be employed for execution of basic functionality of the application 304. In addition, the clusters 404 populated with compute resource intensive instances of the reconfigurable hardware devices 202 can be employed for execution of the compute-intensive ancillary functionality that is swapped in and out of the compute resource intensive instances of the reconfigurable hardware devices 202.

Each of the clusters 404 can be analyzed to estimate an amount of time for implementing a functionality of the application 304 based on an actual capacity (or size) and an actual I/O density of the reconfigurable hardware devices 202 that are used to map the application 304. As an application mix of a number of the application 304 runs in the computing system 100, performance can be measured and a mix of the clusters 404 can be adjusted according to actual run-time characteristics. The application mix refers to the number of the application 304 that need to be mapped to resources that are I/O-intensive, compute-intensive, or a combination thereof.

Placement of the clusters 404 can depend on the application mix. If an I/O-intensive functionality of the application 304 is localized in the reconfigurable hardware devices 202, the clusters 404 that are I/O-intensive can be clustered together, thereby decongesting the communication network 502 of the computing system 100. If an I/O-intensive functionality of the application 304 functions as a hub for a compute-intensive functionality, the clusters 404 that are I/O-intensive can be distributed amongst the clusters 404 that are compute-intensive.

Figure 6:
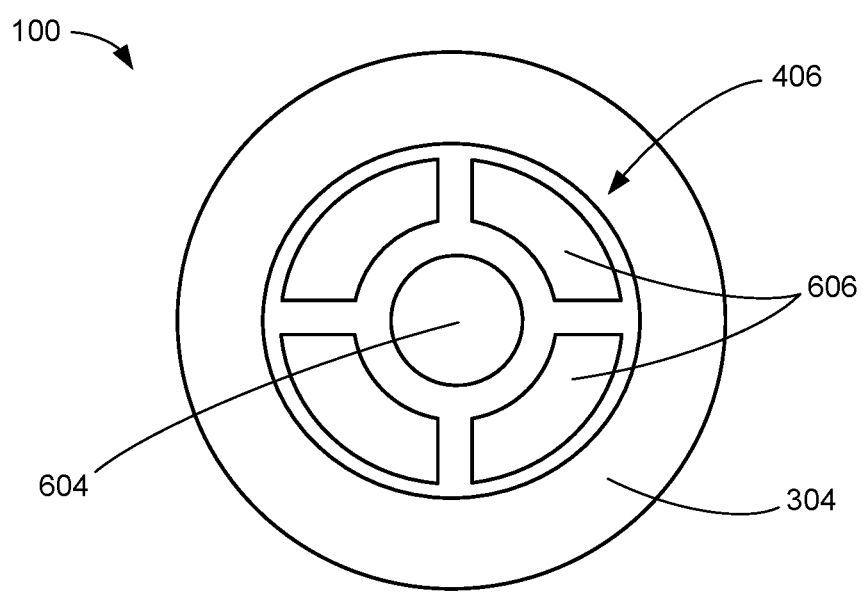
FIG. 6 is an architecture diagram of the application in the computing system.

Referring now to FIG. 6, therein is shown an architecture diagram of the application 304 in the computing system 100. Each of the kernel units 406 can include a microkernel 604 and kernel modules 606. The microkernel 604 can provide control, management, and communication capabilities for each of the kernel units 406 to interface with the reconfigurable hardware devices 202 of FIG. 2 to implement and execute functionality of the application 304.

The kernel modules 606 augment functionality of the microkernel 604 by providing additional control and management capabilities that are not implemented in the microkernel 604. The kernel units 406 can be configured for the application 304 by compiling and synthesizing the kernel modules 606 expressly chosen for an application domain of the application 304. The application 304 can be loaded and executed on the reconfigurable hardware devices 202.

The application domain refers to a type of a number of the application 304 that are grouped based on similar functionalities. The application domain depends on problems that the number of the application 304 is implemented to solve. For example, the application domain can include encryption, computer vision, and synthetic-aperture radar that can be supported with high-performance computing functionalities implemented in the number of the application 304.

The application 304 can be launched in a layer outside each of the kernel units 406 having the microkernel 604 and the kernel modules 606. For example, the application 304 can be developed using a programming language including C++ and VHSIC hardware description language (VHDL) where VHSIC stands for very-high-speed integrated circuits. Also for example, the application 304 can be developed with Open Computing Language (OpenCL) programs and compiled to run with an execution platform with only hardware using the reconfigurable hardware devices 202.

The application 304 can be mapped to and executed by the reconfigurable hardware devices 202. A method of mapping and implementing a representation or a bitstream of the application 304 can be managed by each of the kernel units 406 with the microkernel 604 and the kernel modules 606.

Figure 7:
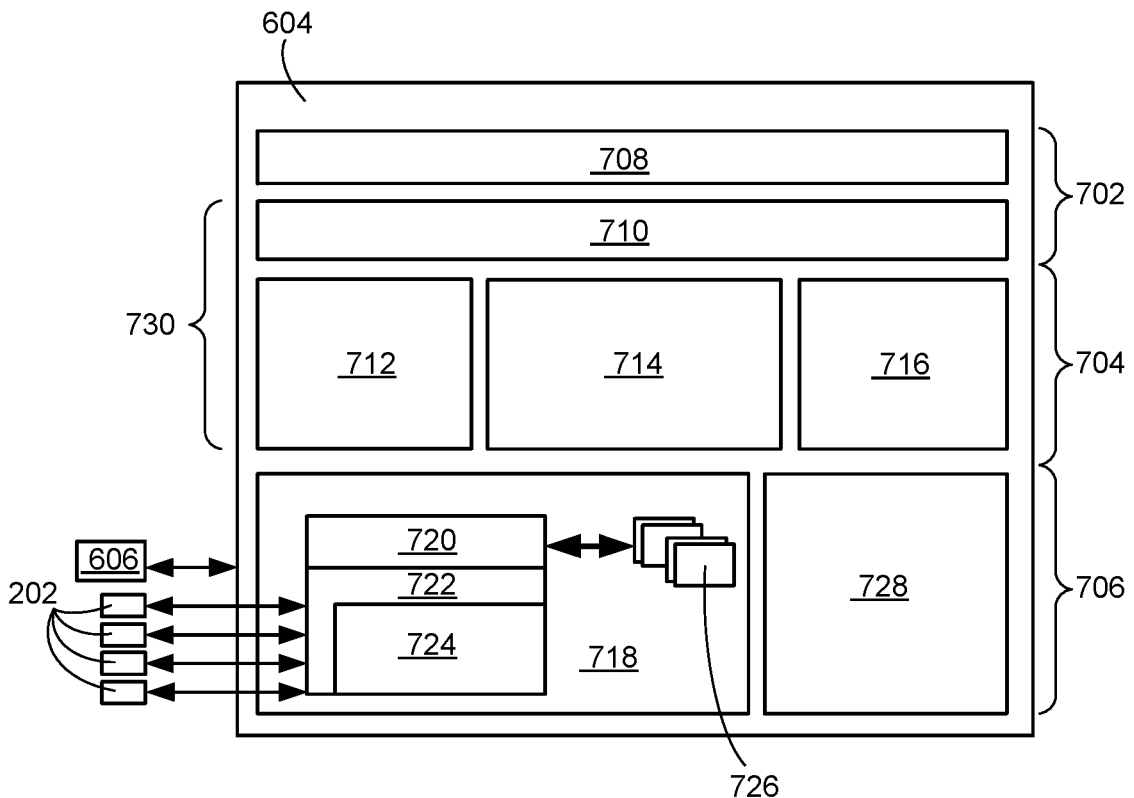
FIG. 7 is a hardware block diagram of the microkernel.

Referring now to FIG. 7, therein is shown a hardware block diagram of the microkernel 604. The microkernel 604 can be implemented with vital functions common to various types of a number of the application 304 of FIG. 3 that operates in a similar fashion across all application domains. The microkernel 604 does not operate in a stand-alone form but instead with the kernel modules 606.

The microkernel 604 can include operation functions including communications, logic multiplexing, security primitives, job scheduling, and distributed control. The microkernel 604 is an interworking system of sub-functions, organized as shown in FIG. 7. The microkernel 604 can include the sub-functions that are stratified into three layers including a control layer 702, a support layer 704, and a run-time layer 706.

The control layer 702 performs a job control and includes a microkernel interface (not shown). The control layer 702 can include a user interface unit 708 and an application manager 710 for performing control functions including session management, control plane security, and job scheduling.

The support layer 704 provides scheduling support and network management. The support layer 704 can include a module manager 712, a resource manager 714, and an event manager 716 for performing support functions including scenario validation, event handling, and remote kernel interface management.

The run-time layer 706 provides an application run-time plant. The run-time layer 706 can include run-time blocks including an intra-cluster communication unit 718 having a buffer manager 720 and a virtual bus 722 with a switch fabric 724. The run-time layer 706 can include the run-time blocks including a number of memory devices 726 and an inter-cluster communication unit 728. The run-time layer 706 can include the run-time blocks for performing run-time functions including interfacing with the reconfigurable hardware devices 202 and performing application fragment interconnect, signal management, network interface, and network and application interface security.

The microkernel 604 can include a schedule engine 730 for scheduling portions of a number of the reconfigurable hardware devices 202. The schedule engine 730 can include the application manager 710, the module manager 712, the resource manager 714, and the event manager 716 to support the scheduling.

Sub-blocks of the control layer 702, the support layer 704, and the run-time layer 706 can be connected to each other, the reconfigurable hardware devices 202, and the kernel modules 606. The control layer 702 can interface with the kernel modules 606 and the support layer 704. The support layer 704 can interface with the control layer 702 and the run-time layer 706. The run-time layer 706 can interface with the support layer 704, the reconfigurable hardware devices 202, and the kernel modules 606.

The microkernel 604 can be implemented as a functional foundation for the computing system 100 of FIG. 1, upon which the application 304 can be built such that the application 304 is secure and seamless. The microkernel 604 can embody a coherent collection of functionality appropriate for implementing the application 304.

The microkernel 604 can provide primitives that implement functionality including application module scheduling and maintenance, seamless application fragment interaction, and high-performance application communication. The term "primitives" refers to a simple operation for executing a relatively more complex operation than the simple operation. For example, the primitives can represent low-level commands that are used to execute relatively high-level commands.

For example, the application module scheduling and maintenance can include thread maintenance and module swapping. Also for example, the seamless application fragment interaction can include interconnection and synchronization.

The thread maintenance monitors instantaneous application needs and regulates allocation of resources to the application 304. The thread maintenance is performed for multiple applications or processes.

For example, the thread maintenance can monitor the instantaneous application needs of the application 304 and allocate ancillary logic of the reconfigurable hardware devices 202 that has been swapped out to be used by the application 304. The term "ancillary" refers to spare logic gates that are swapped in to implement a function and swapped out to be available to implement another function when the spare logic gates are subsequently needed. Also for example, the thread maintenance can determine that a pipeline stall associated with feedback can require treatment.

The module swapping circumscribes or includes functionality associated with process scheduling including networked database support, identification of appropriate application fragment, run-time application fragment place and route, attachment and registration of application fragment alarms, and intra-application fragment signal handling configuration.

For the seamless application fragment interaction, the microkernel 604 can facilitate run-time synchronization at application grain boundaries including flow-control and management of pipeline stalls involving pipelines that span the application grain boundaries. The term "fragment" refers to a portion of the application 304.

The microkernel 604 can also provide for bus interconnection and reliable delivery of application signal information from outputs to fanned-out inputs at application fragment grain boundaries. The application fragment grain boundaries are perimeters of groups of programmable blocks in the reconfigurable hardware devices 202, where interconnects or wires are connected between the groups.

For the high-performance application communication, the microkernel 604 can provide a low-overhead communication infrastructure to the application 304 developed as any combination of software and hardware on top of or outside the microkernel 604 and the kernel modules 606. Wrappers or interfaces for the application 304 can be written in hardware or software outside the microkernel 604 and the kernel modules 606 to seamlessly adapt the low-overhead communication infrastructure to a number of protocols.

Figure 8:
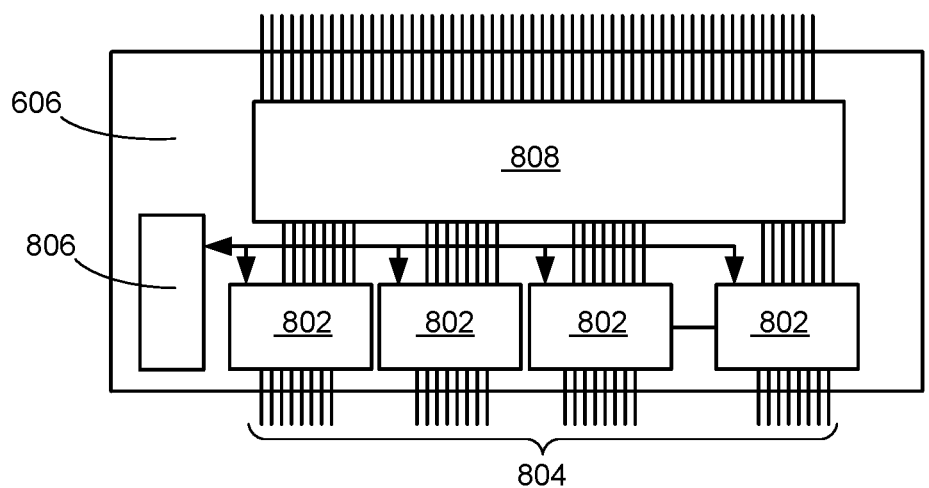
FIG. 8 is an architecture diagram of one of the kernel modules.

Referring now to FIG. 8, therein is shown an architecture diagram of one of the kernel modules 606. Each of the kernel units 406 of FIG. 4 can include the kernel modules 606 in addition to the microkernel 604 of FIG. 6 to provide hardware platform functionality that can spread across a number of the line cards 112 of FIG. 1, the tandem kernel 402 of FIG. 4, the kernel units 406, or a combination thereof. The kernel units 406 can be shaped or configured for the application domain with the kernel modules 606.

Each of the kernel modules 606 can include a microkernel interface unit 802. The microkernel interface unit 802 provides communication capability for each of the kernel modules 606 to communicate with the microkernel 604 through a kernel expansion bus 804. The kernel expansion bus 804 provides connectivity between the microkernel interface unit 802 and the microkernel 604.

The microkernel interface unit 802 can support a variety of bus widths and protocols appropriate to functionality of the microkernel 604. Each of the kernel modules 606 can include a security unit 806 to monitor a kernel module security status and determine whether each of the kernel units 406 operates in a secured mode.

Each of the kernel modules 606 can include a configurable functionality unit 808 that interfaces between the microkernel interface unit 802 and user logic devices. The user logic devices are non-kernel logic devices that are implemented outside the kernel units 406. The user logic devices can be used to transmit application related information of the application 304 of FIG. 3 to the kernel units 406 for authentication, configuration, and management of the reconfigurable hardware devices 202 of FIG. 2. For example, the configurable functionality unit 808 can interface with the user logic devices through a communication bus including Peripheral Component Interconnect (PCI) or a system bus on a motherboard or a system board.

The configurable functionality unit 808 includes developed supplemental logic to support a number of configuration functionalities. For example, the configuration functionalities can be associated with the policy including module swapping rules, privilege and authentication rules, scheduling rules, function cache allocation, database management, and managing events and event relationships. Also for example, the configuration functionalities can be associated with interface domain diversity, high-usage application domain functions, issues of waiting logic, and system scalability.

For a specific example, interface domain diversity can imply behavioral sub classification. In other words, the kernel modules 606 house or include interface functionality based on a sub-classification because different interface domains have different characteristics. For instance, the different characteristics or differentiation can be based on speed and latency. Latency can be affected by inherent equipment constraints or by physical distance between nodes that represent locations of the reconfigurable hardware devices 202.

The kernel modules 606 can be implemented with the functionalities based on application parameters or features that are not implemented in the microkernel 604. For example, the kernel modules 606 can be implemented with functionalities including supports for shell programs and file systems.

The microkernel 604 and the kernel modules 606 can be implemented with any number of electronic components including an application-specific integrated circuit (ASIC), a field-programmable gate array (FPGA). For example, the microkernel 604 and the kernel modules 606 can altogether be implemented with an ASIC, an FPGA, or a combination thereof.

Figure 9:
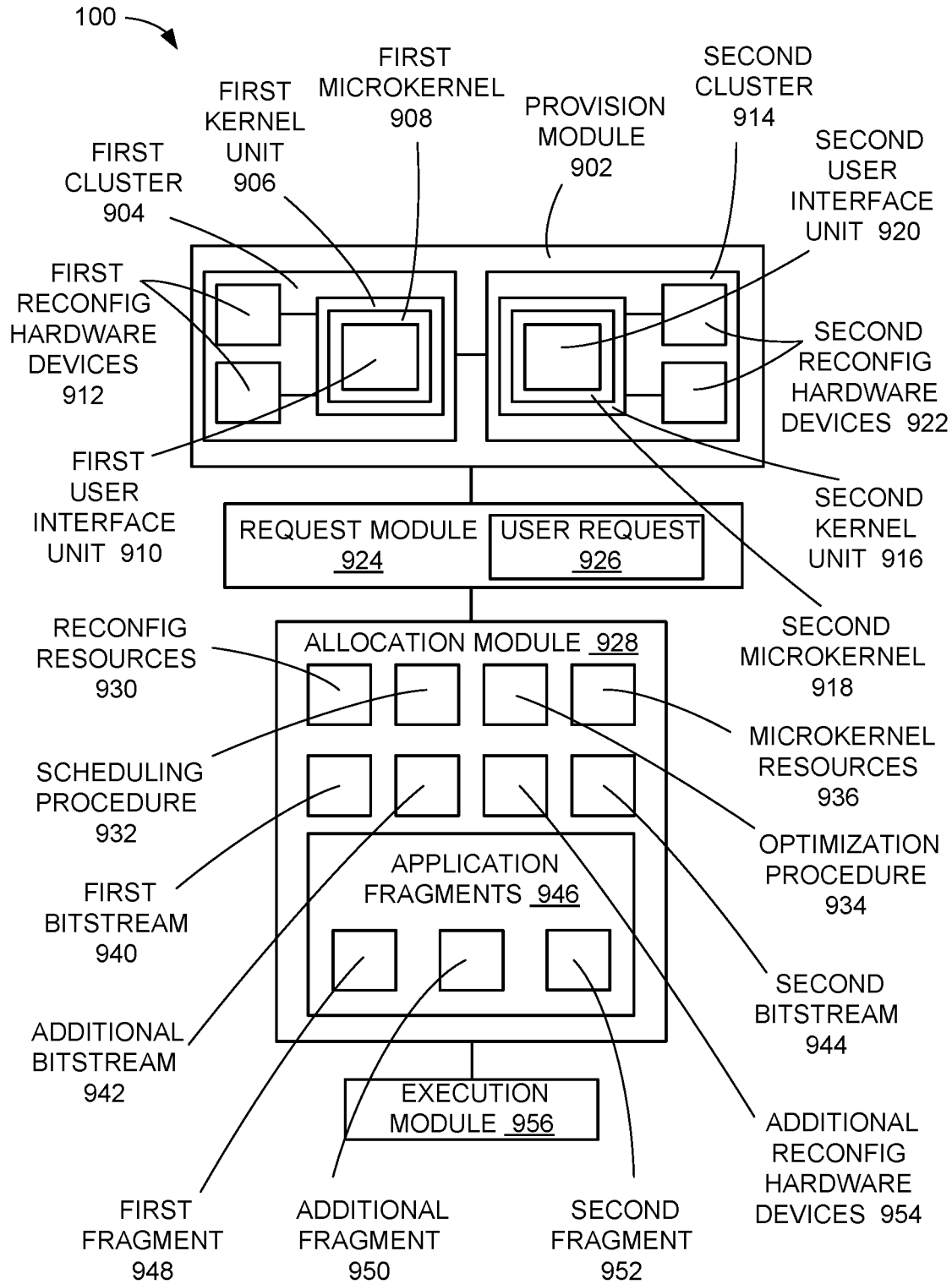
FIG. 9 is an example of a hardware block diagram of the computing system.

Referring now to FIG. 9, therein is shown an example of a hardware block diagram of the computing system 100. The computing system 100 can include a hardware platform in a form of a kernel that supports swappable, re-locatable hardware applications. The hardware platform includes an interworking set of the control layer 702 of FIG. 7, the support layer 704 of FIG. 7, and the run-time layer 706 of FIG. 7. The term "run-time" refers to a time when the application 304 of FIG. 3 is executed in the computing system 100.

The computing system 100 can include a provision module 902 for providing and configuring the clusters 404 of FIG. 4. The provision module 902 can generate a first cluster 904, which is one of the clusters 404. The first cluster 904 can be generated by grouping a first kernel unit 906 having a first microkernel 908 with a first user interface unit 910. The first cluster 904 can include a number of first reconfigurable hardware devices 912.

The first reconfigurable hardware devices 912 can be grouped together into the first cluster 904 based on the application descriptor 506 of FIG. 5. For example, instances of the first reconfigurable hardware devices 912 that are compute-intensive, I/O-intensive, or a combination thereof can be grouped together. The instances of the first reconfigurable hardware devices 912 can be grouped together with the switching and buffering mechanism for transmission of information or data among the instances. The instances can communicate with each other through the first kernel unit 906 or optionally directly to each other.

The first kernel unit 906 is one of the kernel units 406 of FIG. 4. The first microkernel 908 is the microkernel 604 of FIG. 6. The first user interface unit 910 is the user interface unit 708 of FIG. 7 of the microkernel 604. The first reconfigurable hardware devices 912 are the reconfigurable hardware devices 202 of FIG. 2 connected to the one of the kernel units 406.

The first kernel unit 906 can be implemented and dynamically reconfigured to manage the first reconfigurable hardware devices 912. For illustrative purposes, the hardware block diagram depicts two of the first reconfigurable hardware devices 912, although it is understood that any number of the first reconfigurable hardware devices 912 can be connected to the first kernel unit 906.

The provision module 902 can generate a second cluster 914, which is another of the clusters 404. The second cluster 914 can be generated by grouping a second kernel unit 916 having a second microkernel 918 with a second user interface unit 920. The second cluster 914 can include a number of second reconfigurable hardware devices 922.

The second reconfigurable hardware devices 922 can be grouped together into the second cluster 914 based on the application descriptor 506. For example, instances of the second reconfigurable hardware devices 922 that are compute-intensive, I/O-intensive, or a combination thereof can be grouped together. The instances of the second reconfigurable hardware devices 922 can be grouped together with the switching and buffering mechanism for transmission of information or data among the instances. The instances can communicate with each other through the second kernel unit 916 or optionally directly to each other.

The second kernel unit 916 is another of the kernel units 406. The second microkernel 918 is another of the microkernel 604. The second user interface unit 920 is another of the user interface unit 708 of the another of the microkernel 604. The second reconfigurable hardware devices 922 are the reconfigurable hardware devices 202 connected to the another of the kernel units 406.

The second kernel unit 916 can be implemented and dynamically reconfigured to manage the second reconfigurable hardware devices 922. For illustrative purposes, the hardware block diagram depicts two of the second reconfigurable hardware devices 922, although it is understood that any number of the second reconfigurable hardware devices 922 can be connected to the second kernel unit 916.

For example, the first cluster 904 and the second cluster 914 can be included in one of the line cards 112 of FIG. 1. Also for example, the first cluster 904 can be included in one of the line cards 112 and the second cluster 914 can be included in another of the line cards 112. Further, for example, the first cluster 904 and the second cluster 914 can be included in the tandem kernel 402 of FIG. 4. Yet further, for example, the first cluster 904 and the second cluster 914 can be included in the tandem kernel 402 and another of the tandem kernel 402, respectively.

The first cluster 904 and the second cluster 914 can represent multiple instances of the clusters 404. The multiple instances of the clusters 404 can represent kernel planes fused into a single system image from an application perspective providing arbitrary scale of applications. The single system image can represent a merged image of the computing system 100.

The first cluster 904 and the second cluster 914 can be coupled to each other. The first cluster 904 and the second cluster 914 can be directly connected in a back-to-back or point-to-point connection. The first cluster 904 and the second cluster 914 can optionally be connected through the communication network 502 of FIG. 5, the communication interface 504 of FIG. 5, or a combination thereof.

The first cluster 904 and the second cluster 914 can be initially configured with the first reconfigurable hardware devices 912 and the second reconfigurable hardware devices 922, respectively. The first cluster 904 and the second cluster 914 can be configured or provided based on the application descriptor 506 since the first reconfigurable hardware devices 912 and the second reconfigurable hardware devices 922, respectively, can be selected based on the application descriptor 506 to support the application 304. The first reconfigurable hardware devices 912 and the second reconfigurable hardware devices 922 can be specified by a hardware platform developer of the application 304 or a system administrator of the computing system 100.

A combination of the line cards 112 can include the first cluster 904 and the second cluster 914 based on the application mix. The application mix can also factor into how to set the application descriptor 506 of the line cards 112 and any interconnections on the line cards 112 and between the line cards 112.

The computing system 100 can include a request module 924 for evaluating a user request 926 to initialize the application 304. The request module 924 provides a communication capability for interfacing with the user of the computing system 100, such as the hardware platform developer or the system administrator. The request module 924 can be coupled to the provision module 902.

The application descriptor 506 of the application 304 can indicate if the application 304 is I/O-intensive or compute-intensive. The request module 924 analyzes the application descriptor 506 associated with the application 304 so that the application 304 can be implemented and executed using the first reconfigurable hardware devices 912, the second reconfigurable hardware devices 922, or a combination thereof.

The computing system 100 can include an allocation module 928 for performing scheduling and optimization to generate placement and interconnection of reconfigurable resources 930 for implementing the application 304. The allocation module 928 can be coupled to the request module 924.

The reconfigurable resources 930 are defined as programmable logic blocks and interconnects in the first reconfigurable hardware devices 912, the second reconfigurable hardware devices 922, or a combination thereof. The reconfigurable resources 930 include a number of programmable devices, embedded memories, locations of the programmable devices and the embedded memories, and interconnections among the programmable devices. The programmable devices can include logic gates, flip-flops, and memory elements.

The allocation module 928 can perform a scheduling procedure 932 and an optimization procedure 934 for implementing functions of the application 304. The scheduling procedure 932 is a method that determines which and when microkernel resources 936 are allocated to perform the optimization procedure. The optimization procedure is a method that determines the reconfigurable resources 930 in the first reconfigurable hardware devices 912, the second reconfigurable hardware devices 922, or a combination thereof that are used to implement the functionalities of the application 304.

The microkernel resources 936 are defined as resources in the microkernel 604 including logic gates, storage elements, interconnections, and buffer allocation for implementation of the application 304. The microkernel resources 936 can include portions of the first user interface unit 910, the application manager 710 of FIG. 7, the module manager 712 of FIG. 7, the resource manager 714 of FIG. 7, the event manager 716 of FIG. 7, the intra-cluster communication unit 718 of FIG. 7, the buffer manager 720 of FIG. 7, the virtual bus 722 of FIG. 7, the switch fabric 724 of FIG. 7, the memory devices 726 of FIG. 7, and the inter-cluster communication unit 728 of FIG. 7.

The allocation module 928 can generate a first bitstream 940, an additional bitstream 942, a second bitstream 944, or a combination thereof. The first bitstream 940, the additional bitstream 942, and the second bitstream 944 are defined as sequences of digital information represented in binary digits. The first bitstream 940 and the additional bitstream 942 can be used for implementing different portions, such as a first portion and a second portion, of the application 304 when the application 304 cannot be implemented with just the first bitstream 940.

The application 304 can be partitioned into a number of application fragments 946, which are defined as portions of the application 304. The application fragments 946 can include a first fragment 948, an additional fragment 950, and a second fragment 952. The first fragment 948, the additional fragment 950, and the second fragment 952 are defined as portions of the application 304.

The first fragment 948, the additional fragment 950, and the second fragment 952 can be implemented using the first bitstream 940, the additional bitstream 942, and the second bitstream 944, respectively. The first fragment 948 and the additional fragment 950 can be implemented using the first cluster 904. The second fragment 952 can be implemented using the second cluster 914.

The first bitstream 940, the additional bitstream 942, and the second bitstream 944 can represent hardware encodings of portions of the application 304. The first bitstream 940 and the additional bitstream 942 can be loaded into any number of the first reconfigurable hardware devices 912. The second bitstream 944 can be loaded into one of the second reconfigurable hardware devices 922.

There can be any number of the first bitstream 940 and any number of the second bitstream 944 generated. For example, if the application 304 can be implemented using a contiguous section of programmable blocks in the first reconfigurable hardware devices 912, the allocation module 928 can generate just the first bitstream 940. Also for example, if the application 304 cannot be implemented using the contiguous section, the allocation module 928 can generate the additional bitstream 942 in addition to the first bitstream 940.

In the latter case, functionalities of the application 304 can be implemented by the first bitstream 940 and the additional bitstream 942. The first bitstream 940 and the additional bitstream 942 can be loaded into any number of the first reconfigurable hardware devices 912, wherever there are programmable blocks and interconnects in the first reconfigurable hardware devices 912 that are available for implementing the application 304.

For example, the first bitstream 940 and the additional bitstream 942 can be loaded into only one of the first reconfigurable hardware devices 912. Also for example, the first bitstream 940 can be loaded into one of the first reconfigurable hardware devices 912 and the additional bitstream 942 can be loaded into an additional reconfigurable hardware device 954, which is another of the first reconfigurable hardware devices 912 in the first cluster 904.

When functionalities of the application 304 can be implemented using the first cluster 904, only the first bitstream 940 can be generated. When the functionalities of the application 304 cannot be implemented using just the first cluster 904, the functionalities of the application 304 can be implemented using the first cluster 904 and the second cluster 914, and thus the first bitstream 940 and the second bitstream 944 can be generated. In this case, the application 304 can be partitioned into a number of the application fragments 946.

The first bitstream 940 and the second bitstream 944 can be generated for the first fragment 948 and the second fragment 952, respectively. For illustrative purposes, the allocation module 928 is described to include only the first bitstream 940 and the second bitstream 944, although it is understood that the allocation module 928 can include any number of the first bitstream 940, the second bitstream 944, or a combination thereof for implementing all instances of the application fragments 946. The first bitstream 940 and the second bitstream 944 can include encoding of the first fragment 948 and the second fragment 952, respectively.

The first bitstream 940, the second bitstream 944, or a combination thereof can be generated based on the application descriptor 506. For example, when the application descriptor 506 is I/O-intensive, instances of the first reconfigurable hardware devices 912 and the second reconfigurable hardware devices 922, which are capable of performing the high I/O activity, can be loaded with the first bitstream 940 and the second bitstream 944, respectively. Also for example, when the application descriptor 506 is compute-intensive, instances of the first reconfigurable hardware devices 912 and the second reconfigurable hardware devices 922, which include the high compute resource capacity, can be loaded with the first bitstream 940 and the second bitstream 944, respectively.

The computing system 100 can include an execution module 956 for implementing the application 304. The first bitstream 940, the additional bitstream 942, the second bitstream 944, or a combination thereof can be used to implement and execute the application 304. The first bitstream 940 and the additional bitstream 942 can be loaded into any number of the first reconfigurable hardware devices 912 for execution of the first fragment 948 and the additional fragment 950, respectively.

The second bitstream 944 can be loaded into one of the second reconfigurable hardware devices 922 for execution of the second fragment 952. The execution module 956 can be coupled to the allocation module 928. There can be a number of independently operating instances of the application 304 concurrently executed in the first reconfigurable hardware devices 912, the second reconfigurable hardware devices 922, or a combination thereof.

It has been discovered that the provision module 902 for generating the first cluster 904 having the first kernel unit 906 provides improved scalability because the first kernel unit 906 is capable of managing any number of the first reconfigurable hardware devices 912.

It has also been discovered that the provision module 902 for generating the second cluster 914 having the second kernel unit 916 provides improved scalability because the second kernel unit 916 is capable of managing any number of the second reconfigurable hardware devices 922.

It has further been discovered that the request module 924 for analyzing the application descriptor 506 provides improved area and performance since the request module 924 is capable of determining which instances of the first reconfigurable hardware devices 912 and the second reconfigurable hardware devices 922 that are I/O-intensive or compute-intensive in order to efficiently implement the application 304.

It has further been discovered that the allocation module 928 provides improved area and performance because the allocation module 928 is able to effectively generate the first bitstream 940 and the second bitstream 944 since the instances of the first reconfigurable hardware devices 912 and the second reconfigurable hardware devices 922 that are I/O-intensive or compute-intensive are known based on the application descriptor 506.

It has further been discovered that the execution module 956 provides improved performance since the application 304 is able to be executed using multiple instances of the kernel units 406. In other words, the first fragment 948 and the second fragment 952 of the application 304 are simultaneously executed using the first kernel unit 906 and the second kernel unit 916, respectively.

It has further been discovered that the allocation module 928 provides improved performance by generating the additional bitstream 942 to reduce execution time of the application 304 by simultaneously implementing the first bitstream 940 and the additional bitstream 942 using multiple instances of the first reconfigurable hardware devices 912.

Figure 10:
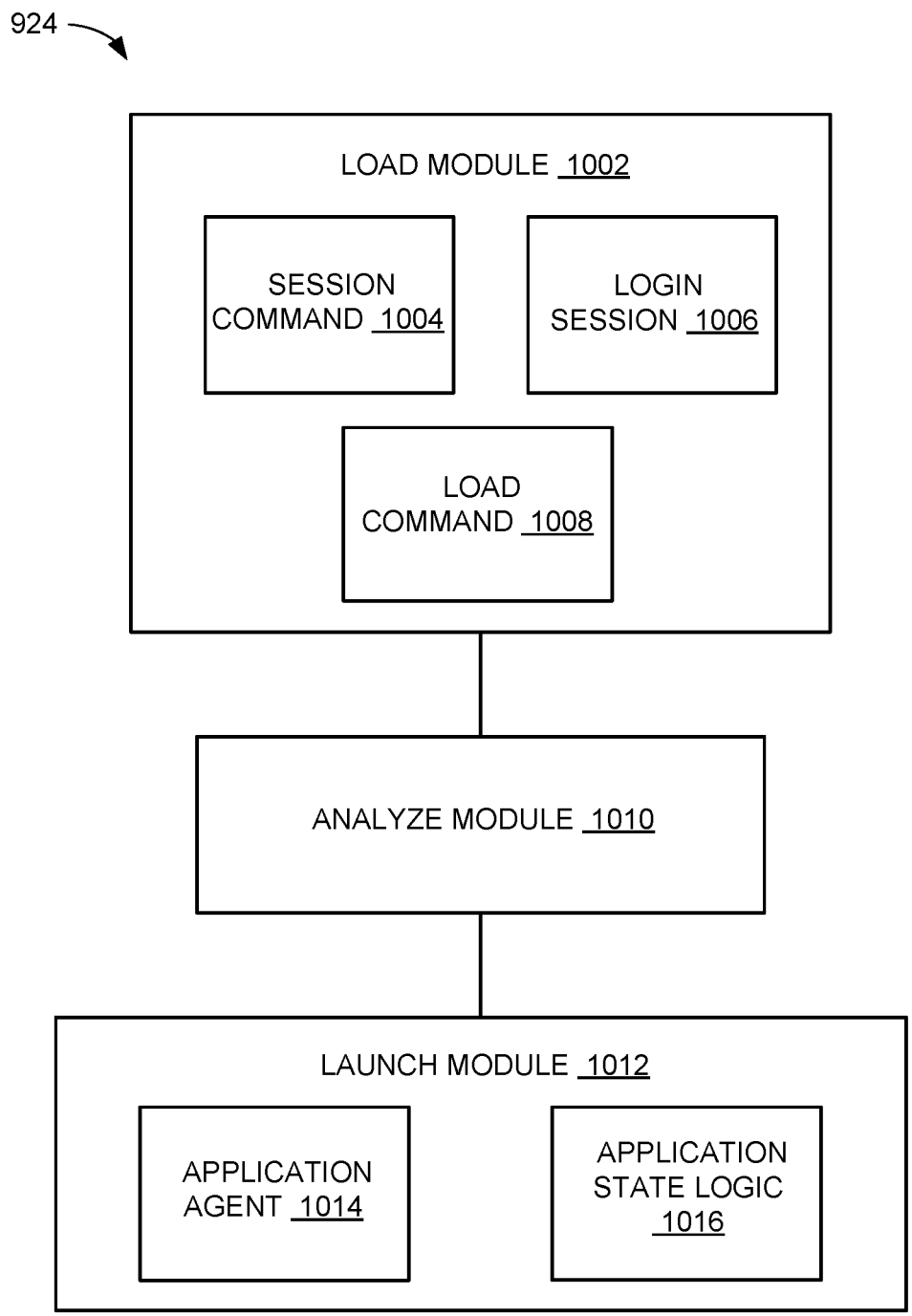
FIG. 10 is a detailed diagram of the request module.

Referring now to FIG. 10, therein is shown a detailed diagram of the request module 924. The request module 924 can include a load module 1002 to provide a communication capability for interfacing with the user of the computing system 100 of FIG. 1. The load module 1002 can be implemented with a portion of the first user interface unit 910 of FIG. 9, which provides authentication and session support.

The load module 1002 can be implemented with the first user interface unit 910 to provide an interface for the user to submit a session command 1004. The session command 1004 can be used to establish a login session 1006 to request the application 304 of FIG. 3 to be loaded.

The login session 1006 is defined as a duration in which communication is permitted. The login session 1006 can include a unique session identifier that distinguishes the login session 1006 from other sessions. The login session 1006 can be authenticated with a password to prevent an unauthorized access.

The first user interface unit 910 can provide an interface for the user to directly log on. The first user interface unit 910 can provide an interface for the first microkernel 908 of FIG. 9 to send the session command 1004 to the second user interface unit 920 of FIG. 9 to establish or create the login session 1006 in the second cluster 914 of FIG. 9.

The session command 1004 is defined as an instruction that starts or ends a user session. The session command 1004 can include a login command and a logout command. The login command establishes the login session 1006 for a user name. A session manager of the second user interface unit 920 can recognize the login command without a need for an authenticated session. After the second user interface unit 920 receives the login command with a valid user name, the login session 1006 can be created in the second cluster 914 so that the first user interface unit 910 can continue to communicate with the second user interface unit 920.

The login command requires a persisted registration of the user name and a submission of the password from the user.

A successful login with a correct user name and the password can result in a return of a session identifier for a newly created user session. The return of the session identifier can be performed by the second user interface unit 920.

The logout command dissolves the login session 1006 tagged with the unique session identifier. The logout command can return all occupied resources in the microkernel resources 936 of FIG. 9, the reconfigurable resources 930 of FIG. 9, or a combination thereof to respective free lists of available resources for re-use.

After the login session 1006 is established, the load module 1002 can generate a load command 1008 for the application 304 per the user's request for the application 304 to be loaded. The load command 1008 is defined as an instruction for loading the application 304 to subsequently perform the scheduling procedure 932 of FIG. 9 and the optimization procedure 934 of FIG. 9. The application 304 can be received by the first cluster 904 of FIG. 9 using the first user interface unit 910 for interfacing with the user.

The first user interface unit 910 and the second user interface unit 920 can also provide the interface for the first microkernel 908 and the second microkernel 918 of FIG. 9, respectively, to communicate with each other through the communication network 502 of FIG. 5, the communication interface 504 of FIG. 5, or a combination thereof. For example, when the functionalities of the application 304 cannot be implemented using just the first cluster 904, the first microkernel 908 can send a login request using the session command 1004 to the second microkernel 918 to establish the login session 1006. In this example, a portion of the functionalities of the application 304 can be implemented using the second cluster 914 and thus the second bitstream 944 of FIG. 9 can be generated by the second microkernel 918.

The user can provide the application descriptor 506 of FIG. 5 of the application 304 to indicate if the application 304 is I/O-intensive or compute-intensive. The load module 1002 can be implemented with a portion of the first user interface unit 910 for interfacing with the user.

The request module 924 can include an analyze module 1010 to analyze the application descriptor 506 associated with the application 304 that is to be implemented in the first cluster 904, the second cluster 914, or a combination thereof. After the load command 1008 is received from the load module 1002, the analyze module 1010 can analyze the application descriptor 506 for the load command 1008. The application descriptor 506 can be analyzed so that the application 304 can be implemented with a number of specific instances of the first reconfigurable hardware devices 912 of FIG. 9, the second reconfigurable hardware devices 922 of FIG. 9, or a combination thereof. The analyze module 1010 can be coupled to the load module 1002.

The analyze module 1010 can record execution times and numbers of input/output (I/O) ports of the reconfigurable resources 930 that have been used to implement previous instances of the application 304 using the first cluster 904, the second cluster 914, or a combination thereof. The execution times can be recorded along with previous instances of the application descriptor 506 of previous instances of the application 304. The analyze module 1010 can analyze the application descriptor 506 by determining which of the first cluster 904, the second cluster 914, or a combination thereof that can be used to implement a current instance of the application 304 based on the execution times and the numbers of input/output ports.

For example, if the application descriptor 506 indicates that the current instance of the application 304 is compute-intensive, the analyze module 1010 can indicate which of the first cluster 904, the second cluster 914, or a combination thereof has the shortest execution time and thus would be the best resource for implementing the current instance of the application 304. Also for example, if the application descriptor 506 indicates that the current instance of the application 304 is I/O-intensive, the analyze module 1010 can indicate which of the first cluster 904, the second cluster 914, or a combination thereof has the most number of I/O ports for implementing the current instance of the application 304.

The application descriptor 506 can be analyzed at any specific instance of time. For example, the application descriptor 506 can be analyzed periodically at a specific time of day when the system is least busy on an average during each day or within a specific duration after receiving the load command 1008.

The request module 924 can include a launch module 1012 to initiate a procedure to launch and execute the application 304 after the launch module 1012 receives the load command 1008. The launch module 1012 can be coupled to the analyze module 1010.

The launch module 1012 can be implemented with a portion of an application agent 1014 in the resource manager 714 of FIG. 7 to receive and evaluate the load command 1008. The application agent 1014 can interface with the first user interface unit 910. The application agent 1014 monitors and controls activity among the control layer 702 of FIG. 7, the support layer 704 of FIG. 7, and the run-time layer 706 of FIG. 7 for the implementation of the application 304 after the login session 1006 has been authorized by the first user interface unit 910.

The launch module 1012 can be implemented with a portion of an application state logic 1016 in the application manager 710 of FIG. 7. The application state logic 1016 tracks states of the microkernel resources 936 and ensures transitions of the states to support loading of the application 304 upon receiving the load command 1008.

The resource manager 714 provides a capability to launch the application 304 and allocate the microkernel resources 936 in the microkernel 604 of FIG. 6 to implement the application 304 using the scheduling procedure 932 and the optimization procedure 934. The resource manager 714 can include a communication manager for controlling the switch fabric 724 of FIG. 7 by setting up and tearing down port-to-multiport connections across a close switch in the switch fabric 724.

The communication manager also configures the virtual bus 722 of FIG. 7, which is a collection of signal wires that are managed or synchronized altogether by the same control signals for transmission of data or information between the first reconfigurable hardware devices 912. The resource manager 714 can include a dispatcher to set up a configuration of the first reconfigurable hardware devices 912 and, upon inception of a request for loading the application 304, data structures in the memory devices 726 of FIG. 7 required to support the application 304.

The event manager 716 of FIG. 7 evaluates events and provides fault or error notifications to subsystems in the control layer 702, the support layer 704, and the run-time layer 706. The event manager 716 can inform the application manager 710, the module manager 712 of FIG. 7, the resource manager 714, or a combination thereof that an alteration in priorities associated with the microkernel resources 936 and the reconfigurable resources 930 for the implementation of the application fragments 946 of FIG. 9. For example, the alteration in the priorities can include addition, subtraction, activation, suspension, or consolidation of the microkernel resources 936, the reconfigurable resources 930, or a combination thereof.

The intra-cluster communication unit 718 of FIG. 7 provides switching and buffering mechanism for transmission of information or data among the first reconfigurable hardware devices 912 or among the second reconfigurable hardware devices 922. The memory devices 726 provide signal buffers for data to flow between the application fragments 946 implemented in the first reconfigurable hardware devices 912.

The inter-cluster communication unit 728 of FIG. 7 provides switching and buffering mechanism for transmission of information or data between the first kernel unit 906 of FIG. 9 and the second kernel unit 916 of FIG. 9. The inter-cluster communication unit 728 can include the communication interface 504. The inter-cluster communication unit 728 can interface with the communication network 502. For example, the inter-cluster communication unit 728 can provide communication between the first reconfigurable hardware devices 912 and the second reconfigurable hardware devices 922 through the first kernel unit 906 and the second kernel unit 916.

The application agent 1014 can inform the application state logic 1016 that the application 304 is to be launched after the application agent 1014 receives the load command 1008. The application state logic 1016 in the application manager 710 can accept directives from the application agent 1014. The directives are commands that are used to control the microkernel resources for launching and implementing the application 304.

It has been discovered that the load module 1002 provides improved scalability by providing the session command 1004 to establish the login session 1006 at the second cluster 914 for implementing the functionalities of the application 304 using not only the first cluster 904 but also the second cluster 914.

Figure 11:
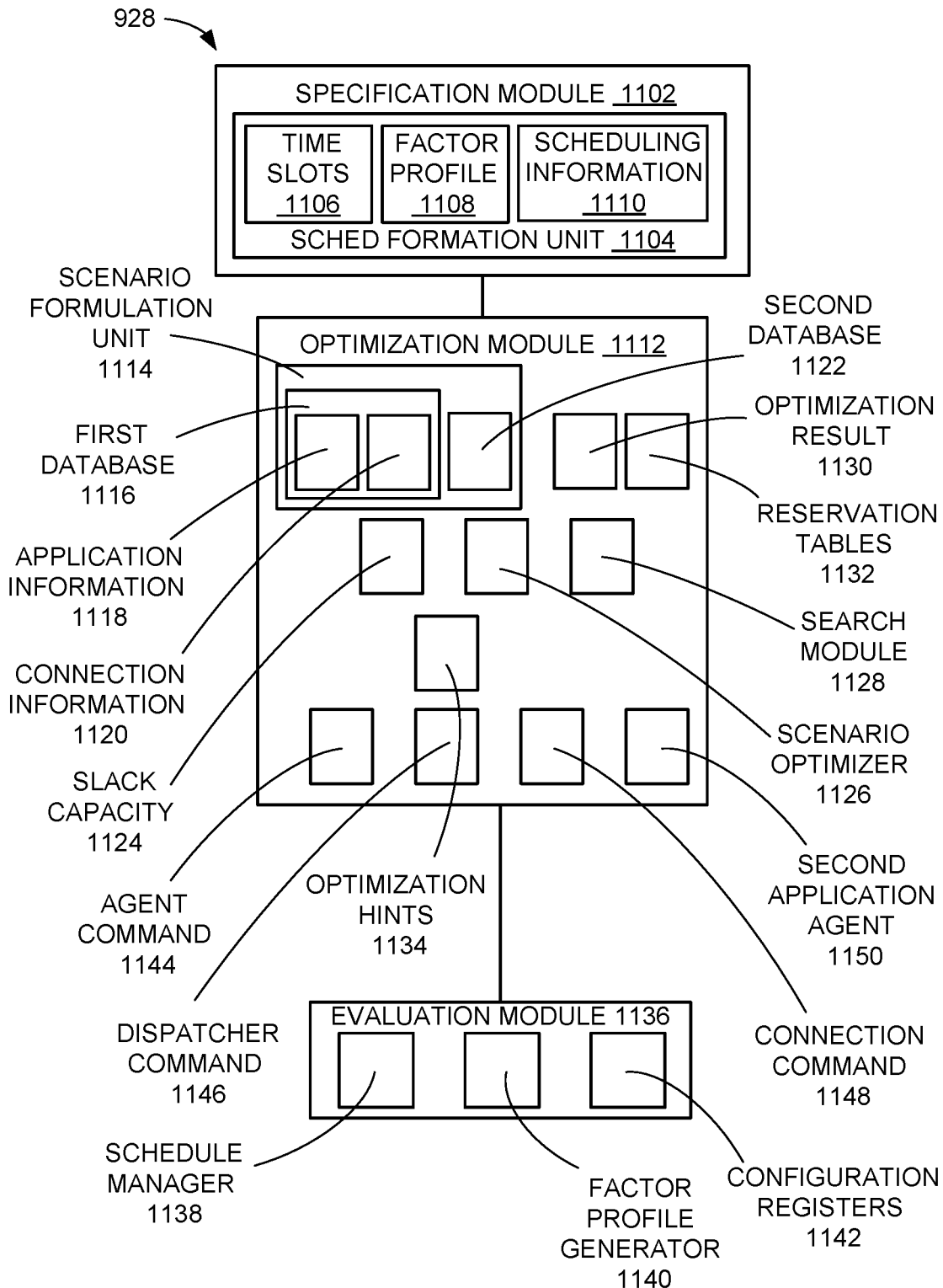
FIG. 11 is a detailed diagram of the allocation module.

Referring now to FIG. 11, therein is shown a detailed diagram of the allocation module 928. The allocation module 928 can include a specification module 1102 for performing the scheduling procedure 932 of FIG. 9. The specification module 1102 can be informed by the launch module 1012 of FIG. 10 that the application 304 of FIG. 3 is to be launched.

The specification module 1102 can be implemented with a portion of a schedule formation unit 1104 in the application manager 710 of FIG. 7. The application state logic 1016 of FIG. 10 can inform the schedule formation unit 1104 that the application 304 is to be launched. The schedule formation unit 1104 performs the scheduling procedure 932 to determine when the optimization procedure is scheduled to be performed for implementation of the application 304. The term "implementation" refers to scheduling, optimization, and execution of the application fragments 946 of FIG. 9.

The optimization procedure 934 of FIG. 9 is scheduled by the schedule formation unit 1104 assigning a number of time slots 1106 reserved for the optimization procedure 934. Each of the time slots 1106 is defined as a non-zero amount of time that is not used and thus available for the optimization procedure 934. Each of the time slots 1106 can represent a scheduling granularity or a unit of time.

The schedule formation unit 1104 can generate a factor profile 1108, which is defined as information that is used for the optimization procedure 934 to perform. The factor profile 1108 can represent an optimization specification that is used to control the optimization procedure 934. The factor profile 1108 can be generated with scheduling information 1110, which is defined as parameter associated with the application 304 for control of the optimization procedure 934. The scheduling information 1110 can include the time slots 1106 and the microkernel resources 936 of FIG. 9 that are used by the optimization procedure 934.

The scheduling information 1110 can include a time limit for how long the optimization procedure 934 is to be performed. When the optimization procedure 934 is performed longer than the time limit, the optimization procedure 934 can automatically restart its procedure up to a maximum iteration number. The scheduling information 1110 can specify an optimization algorithm type that is used by the optimization procedure 934 to select an algorithm for performing an optimization.

The scheduling information 1110 can include a maximum fragment number that is used by the optimization procedure 934 to determine up to how many of the application fragments 946 that the optimization procedure 934 can generate. The maximum fragment number can be applied when the application 304 cannot be implemented due to lack of the microkernel resources 936, the reconfigurable resources 930 of FIG. 9, or a combination thereof. The scheduling information 1110 can include the application descriptor 506 of FIG. 5 so that the optimization procedure 934 can determine instances of the reconfigurable resources 930 that are capable of handling I/O-intensive or compute-intensive functionalities.

The allocation module 928 can include an optimization module 1112 for performing the optimization procedure 934. The optimization module 1112 can be implemented with a portion of a scenario formulation unit 1114 in the module manager 712 of FIG. 7. The scenario formulation unit 1114 performs the optimization procedure 934. The optimization module can be coupled to the specification module 1102.

The scenario formulation unit 1114 can receive the factor profile 1108 from the schedule formation unit 1104 to perform the optimization procedure 934 to determine the reconfigurable resources 930 that are to be used to implement the functionalities of the application 304.

The scenario formulation unit 1114 can perform the optimization procedure 934 at the time slots 1106 specified by the factor profile 1108. The scenario formulation unit 1114 can perform the optimization procedure 934 to determine the reconfigurable resources 930 based on the scheduling information 1110.

The scenario formulation unit 1114 can retrieve information from a first database 1116 provided by the module manager 712 of the first microkernel 908 of FIG. 9. The first database 1116 is defined as a collection of information for determining the microkernel resources 936 and the reconfigurable resources 930 for the implementation of the application 304.

For example, the first database 1116 can include information that can indicate or be used to determine which instances of the microkernel resources 936 that are not used and thus available for the scheduling procedure 932 to scheduling the time slots 1106 for the optimization procedure 934. Also for example, the first database 1116 can include information that can indicate or be used to determine which instances of the reconfigurable resources 930 that are not used and thus available for the optimization procedure 934.

The first database 1116 can include application information 1118 including an application identification (ID), a sector count, an input count, and an output count. The application identification provides a unique identifier of the application 304 when the login session 1006 of FIG. 10 is established. The sector count indicates a number of partitions or portions in specific instances of the reconfigurable resources 930 allocated for implementation of the application 304. The input count and the output count indicate a number of input ports and output ports, respectively, of the partitions or the portions in the specific instances of the reconfigurable resources 930.

The first database 1116 also includes connection information 1120 associated with routing of signals among the first reconfigurable hardware devices 912 of FIG. 9 or among the second reconfigurable hardware devices 922 of FIG. 9. The connection information 1120 can be associated with routing of signals between the first kernel unit 906 of FIG. 9 and the second kernel unit 916 of FIG. 9. For example, the connection information 1120 can be associated with routing of signals between the first reconfigurable hardware devices 912 and the second reconfigurable hardware devices 922 through the first kernel unit 906 and the second kernel unit 916, respectively.

The connection information 1120 can include switch interconnections and input/output switch ports associated with the buffer manager 720 of FIG. 7 and the switch fabric 724 of FIG. 7 in the virtual bus 722 of FIG. 7. The connection information 1120 can include switch interconnections and input/output switch ports associated with the communication interface 504 of FIG. 5 for routing of signals between the first reconfigurable hardware devices 912 and the second reconfigurable hardware devices 922 through the communication network 502 of FIG. 5.

When the implementation of the application 304 is distributed across the first cluster 904 of FIG. 9 and the second cluster 914 of FIG. 9, the first fragment 948 of FIG. 9 implemented in the first cluster 904 can communicate with the second fragment 952 of FIG. 9 implemented in the second cluster 914. In this case, the connection information 1120 can be associated with routing of signals between the first reconfigurable hardware devices 912 and the second reconfigurable hardware devices 922 through the first kernel unit 906 and the second kernel unit 916.

When the implementation of the application 304 is distributed across the first cluster 904 and the second cluster 914, the scenario formulation unit 1114 can retrieve not only the first database 1116 but also a second database 1122. The second database 1122 provides similar functionalities as the first database 1116 except that the second database 1122 is included in another of the module manager 712 of the second microkernel 918 of FIG. 9. The first database 1116 and the second database 1122 can represent a network database that provides an integration of information for determining the microkernel resources 936 and the reconfigurable resources 930 in both the first microkernel 908 and the second microkernel 918 for the implementation of the application fragments 946.

The optimization module 1112 can detect a slack capacity 1124 in the second cluster 914. The slack capacity 1124 is defined as a number of resources available for purposes of implementing a number of the application fragments 946. The slack capacity 1124 can include the microkernel resources 936, the reconfigurable resources 930, or a combination thereof in the second cluster 914.

The slack capacity 1124 can be detected by the optimization module 1112 communicating with the second user interface unit 920 of FIG. 9 with the session command 1004 of FIG. 10. After the login session 1006 is established in the second microkernel 918, the optimization module 1112 can access the second database 1122. The optimization module 1112 can detect the slack capacity 1124 in the second cluster 914 by determining if there are instances of the microkernel resources 936 and instances of the reconfigurable resources 930 that are not used and thus available. The slack capacity 1124 can be detected for the scheduling procedure 932 and the optimization procedure 934 to be performed in the second cluster 914.

The optimization module 1112 can generate the second fragment 952 based on the slack capacity 1124. The second fragment 952 can be generated since the optimization module 1112 detects that there is the slack capacity 1124 available for the scheduling procedure 932 and the optimization procedure 934 to be performed in the second cluster 914. Using the login session 1006, the optimization module 1112 can request the second microkernel 918 to perform the scheduling procedure 932 and the optimization procedure 934 in the second cluster 914 to generate the second bitstream 944 of FIG. 9 for the second fragment 952.

The optimization module 1112 can be implemented with a scenario optimizer 1126 in the resource manager 714 of FIG. 7. The scenario optimizer 1126 provides an array of processing engines for performing the optimization procedure 934 for the first fragment 948 and the second fragment 952 using the reconfigurable resources 930 in the first reconfigurable hardware devices 912 and the second reconfigurable hardware devices 922, respectively. The scenario optimizer 1126 performs the optimization procedure 934 with information from the first database 1116 and the second database 1122 retrieved by the scenario formulation unit 1114 and sent to the scenario optimizer 1126.

The optimization module 1112 can include a search module 1128 for determining the reconfigurable resources 930 and the microkernel resources 936 across the first cluster 904 and the second cluster 914. The search module 1128 can determine the reconfigurable resources 930 and the microkernel resources 936 based on an optimization result 1130 of the optimization procedure 934 performed by the scenario optimizer 1126. The optimization result 1130 provides an indication whether the optimization procedure 934 succeeds or fails.

The search module 1128 can search the first database 1116 to find the microkernel resources 936, the reconfigurable resources 930, or a combination thereof for the optimization procedure 934 to implement the first fragment 948. When the optimization result 1130 indicates that the application 304 cannot be implemented using the microkernel resources 936 in the first microkernel 908, the first reconfigurable hardware devices 912, or a combination thereof, the search module 1128 can expand its search using the second database 1122 of the second microkernel 918.

The search module 1128 can be implemented with the first user interface unit 910 of FIG. 9 of the first microkernel 908 to communicate with the second user interface unit 920 of the second microkernel 918 to establish the login session 1006 at the second kernel unit 916. The search module 1128 can access the second database 1122 to determine if the second microkernel 918 has the microkernel resources 936 and the second reconfigurable hardware devices 922 have the reconfigurable resources 930 for implementing the second fragment 952.

If the search module 1128 is not able to find the microkernel resources 936 and the reconfigurable resources 930 at the second cluster 914, the search module 1128 can continue its search throughout the communication network 502. The search module 1128 can continue its search until the search module 1128 detects any other instances of the clusters 404 of FIG. 4 that can sufficiently provide the microkernel resources 936 and the reconfigurable resources 930 for implementing the second fragment 952.

The optimization result 1130 can include reservation tables 1132, which are collection of information associated with the microkernel resources 936 and the reconfigurable resources 930 that are used to implement the application fragments 946. The reservation tables 1132 can represent a prescription for placement and interconnection of the application fragments 946 into a complete image of the application 304. The reservation tables 1132 can be provided by the first database 1116, the second database 1122, or a combination thereof.

The reservation tables 1132 can be sufficient such that there are enough instances of the microkernel resources 936 and the reconfigurable resources 930 to implement the functionality of the application fragments 946. If the reservation tables 1132 are insufficient such that there are not enough instances of the microkernel resources 936 and the reconfigurable resources 930 to implement the functionality of the application fragments 946, the optimization module 1112 can generate optimization hints 1134. The optimization hints 1134 are defined as information provided to indicate which optimization parameters in the factor profile 1108 are insufficient and by how much based on the microkernel resources 936 and the reconfigurable resources 930 that are available.

The optimization parameters are a set of constraints that are provided by the factor profile 1108. For example, the optimization parameters can represent the scheduling information 1110 including the time slots 1106, the microkernel resources 936, the time limit, the optimization algorithm type, the maximum fragment number, and user input/output pin counts.

As a specific example, the optimization hints 1134 can indicate that the time slots 1106 are not enough to provide sufficient time to perform the optimization procedure 934. As another specific example, the optimization hints 1134 can indicate that the application 304 cannot be partitioned with a number of the application fragments 946 less than the maximum fragment number.

The allocation module 928 can include an evaluation module 1136 for checking the optimization result 1130 from the scenario optimizer 1126. The evaluation module 1136 can be implemented with a schedule manager 1138 in the application manager 710. The schedule manager 1138 performs an evaluation of the optimization result 1130.

The evaluation module 1136 can be implemented with a factor profile generator 1140 in the schedule formation unit 1104 for updating the factor profile 1108 based on the evaluation module 1136 evaluated by the schedule manager 1138. If the optimization result 1130 indicates a success, the factor profile 1108 is not updated and thus the optimization procedure 934 can proceed based on the reservation tables 1132.

If the optimization result 1130 indicates a failure, the factor profile generator 1140 updates the factor profile 1108. The factor profile 1108 can be updated based on the optimization hints 1134. The factor profile 1108 can be updated with parameters within constraints of limits specified by configuration registers 1142 in the schedule formation unit 1104. The configuration registers 1142 include parametric settings specific to each of the time slots 1106 that are used by the optimization procedure 934. After the factor profile 1108 is updated, the optimization procedure 934 is rescheduled to be performed with a new set of the parameters. The optimization procedure 934 can be rescheduled by the scenario formulation unit 1114 restarted to perform the optimization procedure 934 again.

If the optimization result 1130 that the optimization procedure 934 is successful, the reservation tables 1132 can be used as a stable configuration of the microkernel resources 936 and the reconfigurable resources 930. The reservation tables 1132 can be valid for a number of the time slots 1106.

The optimization procedure 934 can be performed in a distributed manner. The first user interface unit 910 in the first microkernel 908 can send the user request 926 of FIG. 9 to the second user interface unit 920 in the second microkernel 918. The first microkernel 908 can establish the login session 1006 to perform the optimization procedure 934 using the microkernel resources 936 and the reconfigurable resources 930 in the second microkernel 918 for the second fragment 952.

The user request 926 can include information from the factor profile 1108 so that the second microkernel 918 can used as a starting point for the optimization procedure 934. If the second microkernel 918 cannot perform the optimization procedure 934 with the factor profile 1108 provided by the first microkernel 908, the second microkernel 918 can provide the optimization hints 1134 back to the first microkernel 908.

The second microkernel 918 can save the optimization result 1130 using another of the reservation tables 1132 stored in the second database 1122. The second microkernel 918 can notify the first microkernel 908 regarding completion of the optimization procedure 934 performed in the second microkernel 918. The first microkernel 908 can subsequently communicate with the second microkernel 918 to retrieve information from the second database 1122 to obtain the optimization result 1130.

The resource manager 714 in the first microkernel 908 can support a user communication facility for communication between the first microkernel 908 and the second microkernel 918. The user communication facility can include a dedicated point-to-point or point-to-multipoint connection between an instance of the kernel modules 606 of FIG. 6 at the first kernel unit 906 and an instance of the kernel modules 606 at the second kernel unit 916. The kernel modules 606 provide an interface for the first cluster 904 and the second cluster 914 to communicate with one another.

Inter-cluster communication between the first fragment 948 in the first cluster 904 and the second fragment 952 in the second cluster 914 can be provided using a set of switch complex commands sent through the intra-cluster communication unit 718 of FIG. 7 and the inter-cluster communication unit 728 of FIG. 7. The switch complex commands provide a mechanism to control data traffic through the switch fabric 724. The switch complex commands provide information for routing, signal buffer configuration, virtual bus configuration, and alarm management.

The optimization module 1112 can generate and send an agent command 1144 from the first microkernel 908 to the second microkernel 918. The agent command 1144 provides control of the microkernel resources 936, the reconfigurable resources 930, or a combination thereof for the implementation of the application fragments 946. The agent command 1144 can be generated by the application agent 1014 of FIG. 10 of the first microkernel 908. The agent command 1144 can be sent from the first user interface unit 910 to the second user interface unit 920.

The agent command 1144 can include a start machine/process command, a halt machine/process command, and a resume machine/process command. The agent command 1144 can include a restart machine/process command, a dissolve machine/process command, an update machine/process factors command, and a change machine/process priority command.

A machine is defined as a physical instance of a logic transformation pipeline. A pipeline is defined as a set of circuitry residing within an instance of the clusters 404, including the reconfigurable hardware devices 202, used to implement the application 304 or a portion thereof. For example, the machine can include a hardware circuitry making up the pipeline or various fragments of circuits, data connections including switches, or a combination thereof.

A process is defined as an exclusive stream of bits constituting a logical context. For example, the process can include command data for controlling and operating the kernel units 406 of FIG. 4, input, output, or intermediate values related to processing by the machine. The process can run through the machine. The machine can support many processes.

The start machine/process command initiates the application 304 with an application identifier (ID) using a factor template with incremental adjustments in a factor list. The factor list can include parameter/value pairs. Placement can be limited to a location list.

The halt machine/process command stalls a machine/process tagged with a machine/process ID. When the halt machine/process command takes effect, a state of data flowing through a machine/process can freeze. No data can enter or leave an affected machine on behalf of a process, and intermediate data can remain unchanged and in place.

The resume machine/process command unfreezes a stalled machine/process tagged with a machine/process ID. When the resume machine/process command takes effect, data can flow through a machine/process and intermediate data associated with the machine can be allowed to change state.

The restart machine/process command resets a machine/process tagged with a machine/process ID. The start machine/process command can include emptying a pipeline and resuming processing inputs starting with the next data in queues feeding input virtual buses.

The dissolve machine/process command halts a machine/process tagged with a machine/process ID, if a machine/process is active. The dissolve machine/process command releases all system resources associated with the machine/process, including a machine/process identifier, for reuse.

The update machine/process factors command changes system parametric values associated with a machine/process tagged with a machine/process ID. Factors are detailed in a factor list, which can include parameter/value pairs.

The change machine/process priority command changes a priority associated with a machine/process tagged with a machine/process ID to a new priority.

The optimization module 1112 can send a dispatcher command 1146 from the first microkernel 908 to the second microkernel 918. The dispatcher command 1146 is a high-level command for controlling programming of the first reconfigurable hardware devices 912 and the second reconfigurable hardware devices 922.

The dispatcher command 1146 can be sent from the first user interface unit 910 to the second user interface unit 920. The dispatcher command 1146 can include the high-level command including an instantiate machine fragment command, a dissolve machine fragment command, a pump machine fragment command, and a siphon machine fragment command. The dispatcher command 1146 can include the high-level command including a verify machine command, a form connection command, a dissolve connection command, a merge stream command, and a split stream command.

The instantiate machine fragment command loads the second bitstream 944 encoding the second fragment 952 into indicated target locations of the second reconfigurable hardware devices 922. The dissolve machine fragment command returns target sectors or portions of the second reconfigurable hardware devices 922 previously allocated to a reset state and thus available for subsequent loading of another of the second bitstream 944.

The pump machine fragment command prepares the second fragment 952 for activation by streaming stored state from an indicated table row into the second fragment 952. This command can include direct memory access backfill of indicated embedded instances of the memory devices 726 of FIG. 7.

The siphon machine fragment command prepares the second fragment 952 for removal by streaming application state out of the second fragment 952 and into an indicated table row. This command can include direct memory access evacuation and buffering of indicated embedded instances of the memory devices 726.

The verify machine command performs a checksum on the programming of the second reconfigurable hardware devices 922 and verifies the checksum against a stored value collected at synthesis or upon completion of the optimization procedure 934. The checksum is defined as fixed-sized information used for detecting errors in data that can be introduced during transmission or storage of the data.

The form connection command attaches application nodes to a trans-core interconnect by configuring interconnect sectors in the second reconfigurable hardware devices 922. The dissolve connection command detaches application nodes from a trans-core interconnect by returning appropriate interconnect sectors to a reset state.

The merge stream command adds a tagged signal to multiplex feeding a threaded machine, which is a hardware resource that is capable of implementing multiple threads of operation. The split stream command removes a tagged signal from multiplex feeding the threaded machine.

In order to establish a connection between the first microkernel 908 and the second microkernel 918, the specification module 1102 or the optimization module 1112 can send a connection command 1148. The connection command 1148 can be sent from the communication manager of the resource manager 714 in the first microkernel 908 to a second application agent 1150 of another of the resource manager 714 in the second microkernel 918. The connection command 1148 opens or closes individual connections between the first microkernel 908 to the second microkernel 918. The connection command 1148 can be sent from the first user interface unit 910 to the second user interface unit 920.

The connection command 1148 can include an open connection command, a close connection command, an activate connection command, a suspend connection command, and a bridge connection command. The connection command 1148 can include a modify connection command, a form channel command, a close channel command, and an activate channel suspend channel.

The open connection command opens a connection from the first kernel unit 906 to each member of a destination list with a respective protocol. The destination list can include the second kernel unit 916 or any other instances of the clusters 404. Either a connection identifier or an error code can be returned from the second application agent 1150 to the communication manager in the first kernel unit 906.

The close connection command closes a connection from the first kernel unit 906 labeled with a connection identifier (ID). An error code can be returned from the second application agent 1150 to the communication manager in the first kernel unit 906.

The activate connection command activates a connection from a suspended state that is attached to the first kernel unit 906 and labeled with a connection ID. An error code can be returned from the second application agent 1150 to the communication manager in the first kernel unit 906.

The suspend connection command suspends a connection from an active state that is attached to the first kernel unit 906 and labeled with a connection ID. An error code can be returned from the second application agent 1150 to the communication manager in the first kernel unit 906.

The bridge connection command connects an input of a connection A to an output of a connection B, and connects an input of the connection B to an output of the connection A. This operation can return a fresh connection identifier or an error code from the second application agent 1150 to the communication manager in the first kernel unit 906. All existing connections remain until manually disconnected.

The modify connection command alters parameters of legs of a connection tagged by a connection ID destined for members of a destination list. The modify connection command affects action upon this collection of connection instances.

The form channel command is associated with a collection of connections in connection ID list for group operations. Options associated with the form channel command can include an assignment of a channel to a virtual bus. If the channel is assigned to the virtual bus, backpressure and enable port numbers can be returned from the second application agent 1150 to the communication manager in the first kernel unit 906. Otherwise, an error code can be returned from the second application agent 1150 to the communication manager in the first kernel unit 906.

The close channel command closes all connections in a channel group from the first kernel unit 906 labeled with a channel ID, and then returns a channel descriptor and an identifier for reuse. An error code can be returned from the second application agent 1150 to the communication manager in the first kernel unit 906.

The activate channel activates a channel from a suspended state that is attached to the first kernel unit 906 and labeled with a channel ID. An error code can be returned from the second application agent 1150 to the communication manager in the first kernel unit 906.

The suspend channel suspends a channel from an active state that is attached to the first kernel unit 906 and labeled with a channel ID. An error code can be returned from the second application agent 1150 to the communication manager in the first kernel unit 906.

It has been discovered that the first database 1116 and the second database 1122 provide improved scalability by providing access for the optimization module 1112 to determine the reconfigurable resources 930 and the microkernel resources 936 across multiple instances of the clusters 404.

It has also been discovered that the slack capacity 1124 provides improved performance because the slack capacity 1124 provides additional instances of the microkernel resources 936 and the reconfigurable resources 930 in the second cluster 914 for implementing and simultaneously implementing the application fragments 946 resulting in reduced execution time of the application 304.

It has further been discovered that the second cluster 914 connected to the first cluster 904 provides improved availability of free resources for implementing the application 304 since the first microkernel 908 is able to communicate with the second microkernel 918 to access the second database 1122 through the communication network 502 and the communication interface 504.

Figure 12:
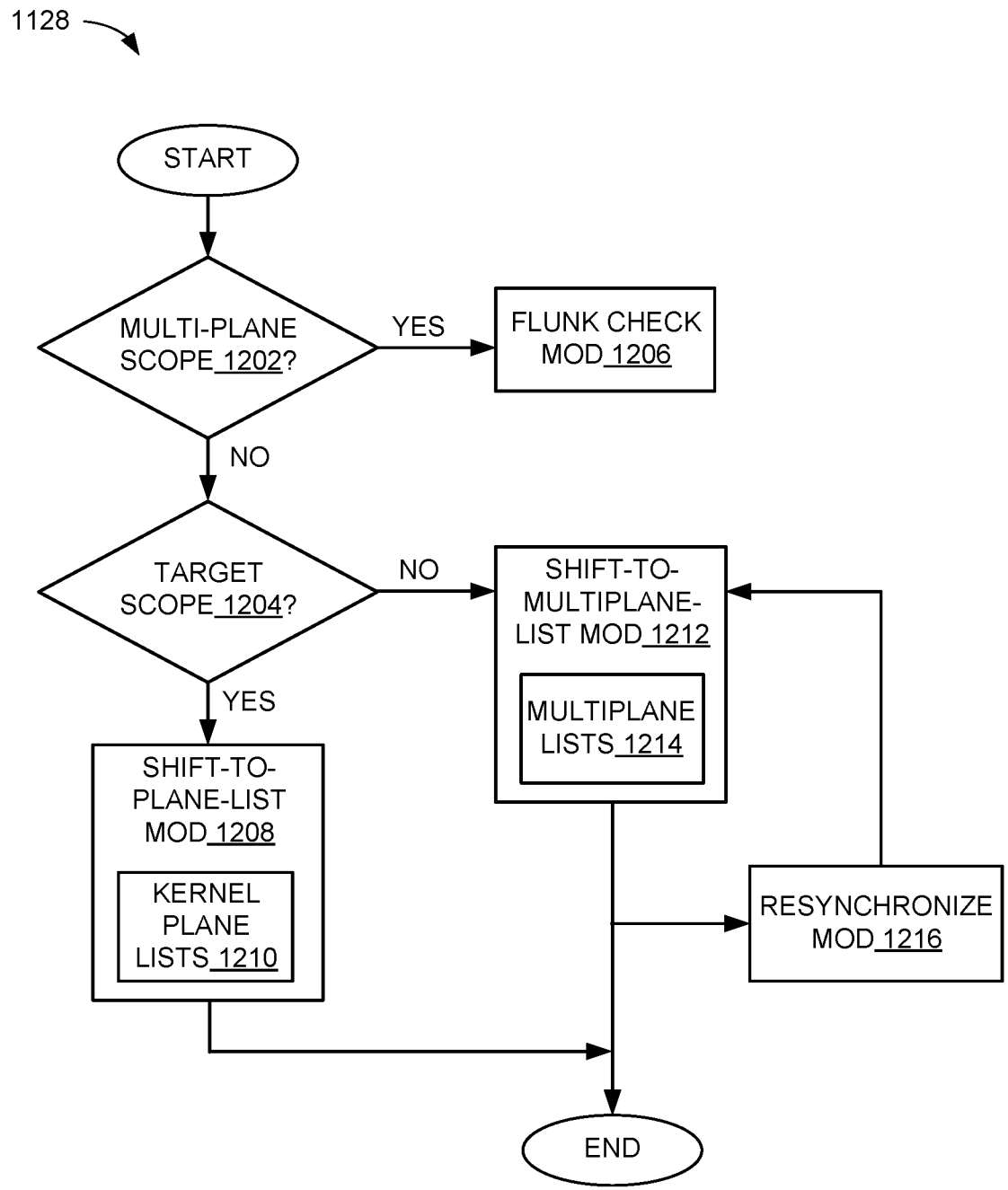
FIG. 12 is a detailed diagram of the search module.

Referring now to FIG. 12, therein is shown a detailed diagram of the search module 1128. The optimization module 1112 of FIG. 11 can include a method of implementing or fitting the application 304 of FIG. 3 to free sectors available in the first reconfigurable hardware devices 912 of FIG. 9, the second reconfigurable hardware devices 922 of FIG. 9, or a combination thereof.

If the fitting is not successful or possible, the search module 1128 can expand a search domain. The search domain can be expanded into multiple of the time slots 1106 of FIG. 11 implying the application 304 that can be spread across more than multiple of the time slots 1106.

If the application 304 has already been placed across multiple of the time slots 1106 and there is still a shortage of the reconfigurable resources 930 of FIG. 9, an error status can be set or registered. The error flag can set or signal an event. Otherwise, a stack of resource lists for the time slots 1106 is cycled. The optimization procedure 934 of FIG. 9 can work through each of the resource lists.

The search module 1128 can expand the search domain for the reconfigurable resources 930 across the first cluster 904 of FIG. 9 and the second cluster 914 of FIG. 9. The reconfigurable resources 930 can be searched for in order to implement the application 304.

The search module 1128 can start a search based on a multi-plane scope 1202 and a target scope 1204. The multi-plane scope 1202 indicates whether the search is performed not only in the first cluster 904 but also in the second cluster 914. The target scope 1204 indicates whether the search is performed to find instances of the first reconfigurable hardware devices 912 that are available for implementation of the application fragments 946 of FIG. 9. The multi-plane scope 1202 and the target scope 1204 can be configured to a known state or assigned to a fixed state in the optimization module 1112.

The search module 1128 can include a flunk check module 1206 to fail a resource check. If the multi-plane scope 1202 is "yes" indicating that the search has been performed in the second cluster 914, the flunk check module 1206 can fail the resource check since the resource check cannot find any of the reconfigurable resources 930 that are available.

The search module 1128 can include a shift-to-plane-list module 1208 to cycle or search through kernel plane lists 1210 to search for available instances of the reconfigurable resources 930. The kernel plane lists 1210 are collections of instances of the first reconfigurable hardware devices 912 that have available sectors for implementation of the application fragments 946. The kernel plane lists 1210 can include portions of the first database 1116 of FIG. 11 including the available sectors in the instances of the first reconfigurable hardware devices 912.

If the multi-plane scope 1202 is "no" indicating that the search has been performed only in the first cluster 904 and the target scope 1204 is "yes" indicating that the search is to be localized to the first reconfigurable hardware devices 912, the shift-to-plane-list module 1208 can search each of the kernel plane lists 1210 for the available sectors in the first reconfigurable hardware devices 912. The shift-to-plane-list module 1208 can search the kernel plane lists 1210 to find or search for the available sectors that fit the functionality of the application fragments 946 to implement the application fragments 946.

The search module 1128 can include a shift-to-multi-plane-list module 1212 to cycle or search through multiplane lists 1214 to search for the available instances of the reconfigurable resources 930. The multiplane lists 1214 are collections of instances of the second reconfigurable hardware devices 922 that have available sectors for implementation of the application fragments 946. The multiplane lists 1214 can include portions of the second database 1122 of FIG. 11 including the available sectors in the instances of the second reconfigurable hardware devices 922.

If the multi-plane scope 1202 is "no" indicating that the search has been performed only in the first cluster 904 and the target scope 1204 is "no" indicating that the search is to be expanded to the second reconfigurable hardware devices 922, the shift-to-multiplane-list module 1212 can search each of the multiplane lists 1214 for the available sectors in the second reconfigurable hardware devices 922. The shift-to-multiplane-list module 1212 can search the multiplane lists 1214 to find or search for the available sectors that fit the functionality of the application fragments 946 to implement the application fragments 946.

If the available sectors can be reserved, the search module 1128 can assert or indicate that the search ends. The available sectors can be included or reserved in the reservation tables 1132 of FIG. 11. The search module 1128 can confirm that the reservation tables 1132 are ready for use.

The search module 1128 can include a resynchronize module 1216 to obtain an updated copy of the multiplane lists 1214 in order for the shift-to-multiplane-list module 1212 can be performed again. If the available sectors cannot be reserved to implement the application fragments 946, the resynchronize module 1216 can resynchronize to get an update of the multiplane lists 1214. The shift-to-multiplane-list module 1212 can get the update of the multiplane lists 1214 and perform its search again.

It has been discovered that the search module 1128 effectively improves the search for the reconfigurable resources 930 by performing the search using the shift-to-multiplane-list module 1212 and the resynchronize module 1216 in addition to the shift-to-plane-list module 1208 resulting in detection of the available sectors for implementing the application fragments 946.

The computing system 100 of FIG. 1 describes the module functions or order as an example. The modules can be partitioned differently. Each of the modules can operate individually and independently of the other modules. For example, the analyze module 1010 of FIG. 10 and the launch module 1012 of FIG. 10 can be implemented in one module instead of two different modules.

Figure 13:
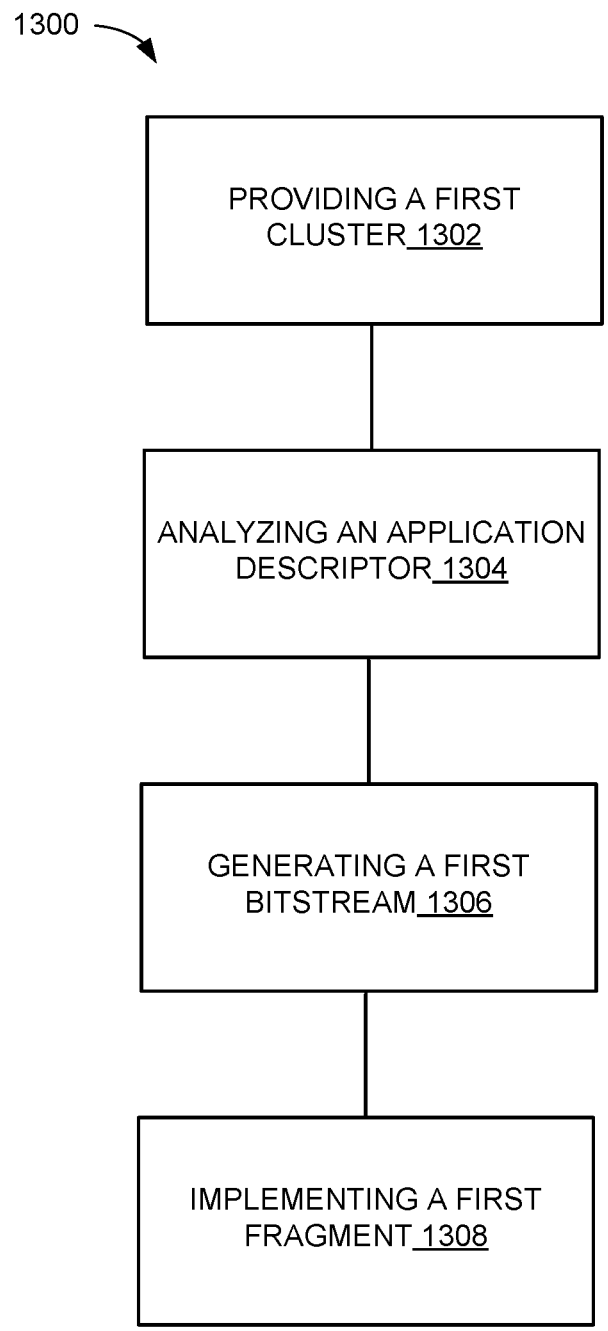
FIG. 13 is a flow chart of a method of operation of the computing system of FIG. 1 in a further embodiment of the present invention.

Referring now to FIG. 13, therein is shown a flow chart of a method 1300 of operation of the computing system 100 of FIG. 1 in a further embodiment of the present invention. The method 1300 includes: providing a first cluster having a first kernel unit for managing a first reconfigurable hardware device in a block 1302; analyzing an application descriptor associated with an application in a block 1304; generating a first bitstream based on the application descriptor for loading the first reconfigurable hardware device, the first bitstream for implementing at least a first portion of the application in a block 1306; and implementing a first fragment with the first bitstream in the first cluster in a block 1308.

Thus, it has been discovered that the computing system of the present invention furnishes important and heretofore unknown and unavailable solutions, capabilities, and functional aspects for a computing system with hardware reconfiguration mechanism. The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a computing system comprising:
generating a first cluster having a first kernel unit for managing first reconfigurable hardware devices;
analyzing an application descriptor associated with an application, wherein the application descriptor is used to determine how the first reconfigurable hardware devices are to be allocated for the application;
generating a first bitstream based on the application descriptor for loading the first reconfigurable hardware devices;
scheduling a first time slot during which reconfigurable resources in the first reconfigurable hardware devices are to be reserved to implement the application;
upon occurrence of the first time slot, implementing a first fragment of the application with the first bitstream in the first cluster loaded into the reconfigurable resources that have been reserved to implement the application;
calculating a first optimization result for the first fragment in a distributed manner based on a second optimization result from a second kernel unit;
suspending a communication channel attached to the first kernel unit and the second kernel unit;
streaming an application state of a machine fragment on the second kernel unit into a database table row of a network database integrated across a first database of the first kernel unit and a second database of the second kernel unit;
dissolving the machine fragment for releasing a portion of the reconfigurable resources allocated to a second fragment on the second kernel unit;
determining a slack capacity for the second kernel unit based on the second optimization result, the slack capacity is an amount of resources available for implementing fragments;
sending a request from the first kernel unit to the second kernel unit, the request indicating insufficient reconfigurable resources in the first kernel unit, the second kernel unit configured to schedule a second time slot and generating the second fragment of the application on the second kernel unit based on the slack capacity using an allocation module implemented in a second reconfigurable hardware devices, and the second reconfigurable hardware devices are field programmable gate array devices;

executing the first fragment with the first kernel unit during the first time slot;

executing the second fragment with the second kernel unit during the second time slot;

dissolving the second fragment;

streaming the application state of the machine fragment from the database table row back into the second kernel unit;

activating the communication channel attached to the first kernel unit and the second kernel unit; and executing the machine fragment in a third time slot.

2. The method as claimed in claim 1 further comprising generating an additional bitstream based on the application descriptor for loading an additional reconfigurable hardware device in the first cluster, wherein the additional bitstream implements the second fragment of the application different from the first fragment implemented by the first bitstream.

3. The method as claimed in claim 1 further comprising sending a session command from the first cluster to a second cluster coupled to the first cluster for requesting the application to be loaded into the second cluster.

4. The method as claimed in claim 1 further comprising searching the first cluster based on a multi-plane scope for the reconfigurable resources to implement the application, the multi-plane scope indicating whether the searching is performed not only in the first cluster but also in a second cluster coupled to the first cluster.

5. The method as claimed in claim 1 wherein the reconfigurable resources include a combination of programmable logic blocks or interconnects.

6. A method of operation of a computing system comprising:

generating a first cluster having a first kernel unit for managing first reconfigurable hardware devices;

generating a second cluster having a second kernel unit for managing second reconfigurable hardware devices;

generating a load command for an application received by the first cluster;

analyzing an application descriptor associated with the application for the load command, wherein the application descriptor is used to determine how the first reconfigurable hardware devices are to be allocated for the application;

generating a first bitstream based on the application descriptor for loading the first reconfigurable hardware devices;

scheduling a first time slot during which reconfigurable resources in the first reconfigurable hardware devices are to be reserved to implement the application;

upon occurrence of the first time slot, implementing a first fragment of the application with the first bitstream in the first cluster loaded into the reconfigurable resources that have been reserved to implement the application;

calculating a first optimization result for the first fragment;

suspending a communication channel attached to the first kernel unit and the second kernel unit;

streaming an application state of a machine fragment on the second kernel unit into a database table row of a network database integrated across a first database of the first kernel unit and a second database of the second kernel unit;

dissolving the machine fragment for releasing a portion of the reconfigurable resources allocated to a second fragment on the second kernel unit;

determining a slack capacity for the second kernel unit based on the second optimization result, the slack capacity is an amount of resources available for implementing fragments;

sending a request from the first kernel unit to the second kernel unit, the request indicating insufficient reconfigurable resources in the first kernel unit, the second kernel unit configured to schedule a second time slot and generating a portion of the application on the second kernel unit for the second fragment of the application on the second kernel unit based on the slack capacity using an allocation module implemented in a second reconfigurable hardware devices, and the second reconfigurable hardware devices are field programmable gate array devices;

executing the first fragment with the first kernel unit during the first time slot;

executing the second fragment with the second kernel unit during the second time slot;

dissolving the second fragment;

streaming the application state of the machine fragment from the database table row back into the second kernel unit;

activating the communication channel attached to the first kernel unit and the second kernel unit; and executing the machine fragment in a third time slot.

7. The method as claimed in claim 6 further comprising:

generating an additional bitstream based on the application descriptor for loading an additional reconfigurable hardware device in the first cluster, wherein the additional bitstream implements the second fragment of the application different from the first fragment implemented by the first bitstream; and implementing the application with the additional bitstream and the first bitstream.

8. The method as claimed in claim 6 further comprising sending a session command from the first cluster to a second cluster coupled to the first cluster to establish a login session in the second cluster for the first cluster to communicate with the second cluster for requesting the application to be loaded into the second cluster.

9. The method as claimed in claim 6 further comprising searching the first cluster and a second cluster coupled to the first cluster based on a multi-plane scope and a target scope for the reconfigurable resources to implement the application, the multi-plane scope indicating whether the searching is performed not only in the first cluster but also in the second cluster, and the target scope indicating whether the search is performed to find the first reconfigurable hardware devices that are available for the first fragment.

10. The method as claimed in claim 6 wherein the reconfigurable resources include a combination of programmable logic blocks or interconnects.

11. A computing system comprising:

a provision module that generates a first cluster having a first kernel unit for managing first reconfigurable hardware devices;

a request module that analyzes an application descriptor associated with an application, wherein the application descriptor is used to determine how the first reconfigurable hardware devices are to be allocated for the application;

an optimization module that streams an application state of a machine fragment on a second kernel unit into a database table row of a network database attached to the first kernel unit and a second kernel unit, dissolves the machine fragment for releasing a portion of the reconfigurable resources allocated to the second fragment on the second kernel unit, sends a request from the first kernel unit to the second kernel unit, the request indicating insufficient reconfigurable resources in the first kernel unit, the second kernel unit configured to schedule a second time slot on the second kernel unit for a second fragment based on the request, suspends a communication channel, activates a communication channel, dissolves the second fragment, streams the application state of the machine fragment from the database table row back into the second kernel unit;

an allocation module that generates a first bitstream based on the application descriptor for loading the first reconfigurable hardware devices, calculating a first optimization result for the first fragment in a distributed manner based on a second optimization results from a second kernel unit, fragment, determining a slack capacity for the second kernel unit based on the second optimization result, the slack capacity is an amount of resources available for implementing fragments; and generating a second fragment of the application on the second kernel unit and the second reconfigurable hardware devices are field programmable gate array devices; and an execution module that schedules a first time slot during which reconfigurable resources in the first reconfigurable hardware devices are to be reserved to implement the application, upon occurrence of the first time slot, implements a first fragment of the application with the first bitstream in the first cluster loaded into the reconfigurable resources that have been reserved to implement the application, executes the first fragment with the first kernel unit during the first time slot, executes the second fragment with the second kernel unit during the second time slot, and executes the machine fragment in a third time slot.

12. The system as claimed in claim 11 wherein the allocation module generates an additional bitstream based on the application descriptor for loading an additional reconfigurable hardware device in the first cluster, wherein the additional bitstream implements the second fragment of the application different from the first fragment implemented by the first bitstream.

13. The system as claimed in claim 11 wherein the request module sends a session command from the first cluster to a second cluster coupled to the first cluster for requesting the application to be loaded into the second cluster.

14. The system as claimed in claim 11 wherein the allocation module searches the first cluster based on a multi-plane scope for the reconfigurable resources to implement the application, the multi-plane scope indicating whether the searching is performed not only in the first cluster but also in a second cluster coupled to the first cluster.

15. The system as claimed in claim 11 wherein the reconfigurable resources include a combination of programmable logic blocks or interconnects.

16. The system as claimed in claim 11 wherein the request module includes a load module that generates a load command for the application received by the first cluster.

17. The system as claimed in claim 16 wherein:
the allocation module generates an additional bitstream based on the application descriptor for loading an additional reconfigurable hardware device in the first cluster, wherein the additional bitstream implements the second fragment of the application different from the first fragment implemented by the first bitstream; and the execution module implements the application with the additional bitstream and the first bitstream.

18. The system as claimed in claim 16 wherein the request module sends a session command from the first cluster to a second cluster coupled to the first cluster to establish a login session in the second cluster for the first cluster to communicate with the second cluster for requesting the application to be loaded into the second cluster.

19. The system as claimed in claim 16 wherein the allocation module searches the first cluster and a second cluster coupled to the first cluster based on a multi-plane scope and a target scope for the reconfigurable resources to implement the application, the multi-plane scope indicating whether the searching is performed not only in the first cluster but also in the second cluster, and the target scope indicating whether the search is performed to find the first reconfigurable hardware devices that are available for the first fragment.

20. The system as claimed in claim 16 wherein the reconfigurable resources include a combination of programmable logic blocks or interconnects.

* * * * *